(12) United States Patent
Rieder et al.

(10) Patent No.: US 12,281,924 B2
(45) Date of Patent: Apr. 22, 2025

(54) VIBRONIC MEASURING SYSTEM FOR MEASURING A MASS FLOW RATE OF A FLUID MEASUREMENT MEDIUM

(71) Applicant: Endress+Hauser Flowtec AG, Reinach (CH)

(72) Inventors: Alfred Rieder, Landshut (DE); Robert Lalla, Lörrach (DE); Marcel Braun, Inzlingen (DE); Ennio Bitto, Aesch (CH); Johan Pohl, Freiburg (DE)

(73) Assignee: Endress+Hauser Flowtec AG, Reinach (CH)

( * ) Notice: Subject to any disclaimer, the term of this patent is extended or adjusted under 35 U.S.C. 154(b) by 411 days.

(21) Appl. No.: 17/757,120

(22) PCT Filed: Nov. 20, 2020

(86) PCT No.: PCT/EP2020/082907
§ 371 (c)(1),
(2) Date: Jun. 9, 2022

(87) PCT Pub. No.: WO2021/115761
PCT Pub. Date: Jun. 17, 2021

(65) Prior Publication Data
US 2022/0412785 A1 Dec. 29, 2022

(30) Foreign Application Priority Data
Dec. 9, 2019 (DE) ...................... 10 2019 133 610.4

(51) Int. Cl.
*G01F 1/84* (2006.01)
*G01R 33/00* (2006.01)
*G01R 33/07* (2006.01)

(52) U.S. Cl.
CPC .......... *G01F 1/8422* (2013.01); *G01F 1/8427* (2013.01); *G01F 1/8436* (2013.01); *G01R 33/0058* (2013.01); *G01R 33/072* (2013.01)

(58) Field of Classification Search
CPC .... G01F 1/8422; G01F 1/8427; G01F 1/8436; G01R 33/0058; G01R 33/072
(Continued)

(56) References Cited

U.S. PATENT DOCUMENTS
2014/0260657 A1  9/2014  Strom et al.

FOREIGN PATENT DOCUMENTS
CN   104272063 A   1/2015
DE   102007062397 A1   7/2009
(Continued)

*Primary Examiner* — Nathaniel T Woodward
(74) *Attorney, Agent, or Firm* — Mark A. Logan; Endress+Hauser (USA) Holding, Inc.

(57) ABSTRACT

The measuring system comprises a vibration-type measuring sensor, a sensor housing, a magnetic-field detector, and measuring-system electronics electrically coupled both to an oscillation exciter and to oscillation-sensing devices of the measuring sensor. The measuring sensor is inside the sensor housing and the magnetic-field detector is outside the sensor housing. The magnetic-field detector is designed to convert changes in the magnetic field into a magnetic-field signal having an amplitude dependent on a magnetic flux through the magnetic-field detector and/or on an area density of said magnetic flux. The measuring-system electronics are designed to determine, on the basis of oscillation measurement signals of the measuring sensor, the mass-flow-rate measurement values representing the mass flow rate and to at least qualitatively determine, on the basis of the magnetic-field signal, whether an external magnetic field is established inside the measuring sensor.

29 Claims, 5 Drawing Sheets

(58) Field of Classification Search
USPC .................................................. 73/861.354
See application file for complete search history.

(56) References Cited

FOREIGN PATENT DOCUMENTS

| | | |
|---|---|---|
| DE | 102008044186 A1 | 6/2010 |
| DE | 102019135253 A1 | 6/2020 |
| EP | 0644403 A1 * | 3/1995 |
| WO | 8803642 A1 | 5/1988 |
| WO | 9313391 A1 | 7/1993 |
| WO | 9726508 A1 | 7/1997 |

* cited by examiner

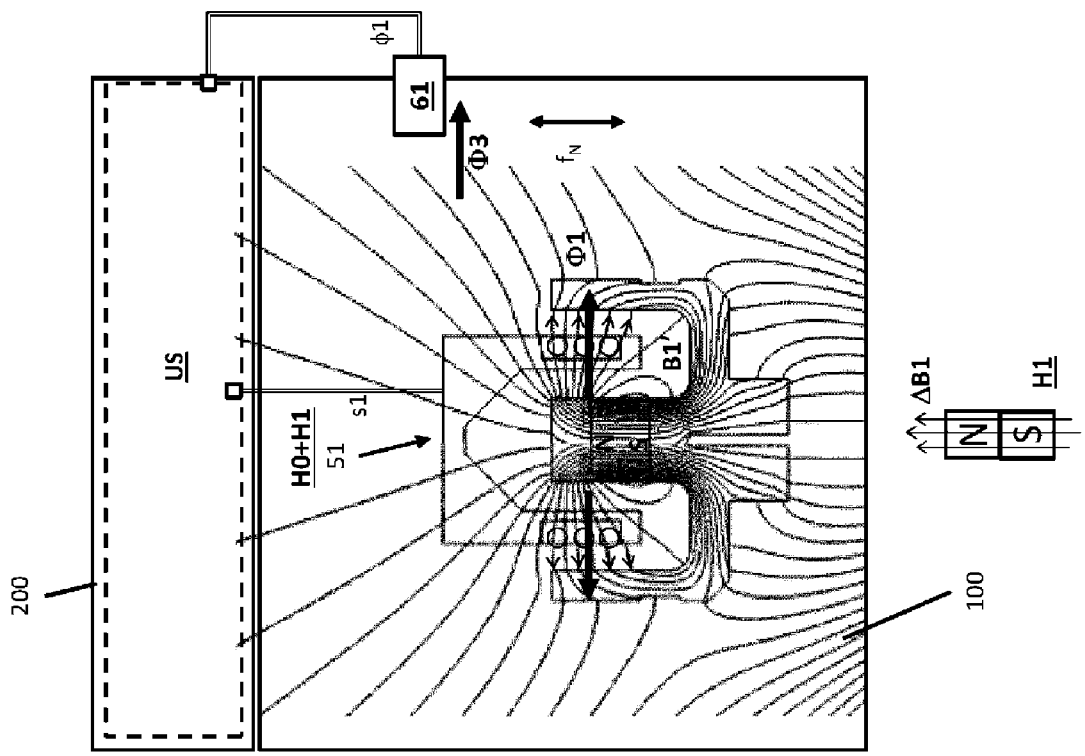
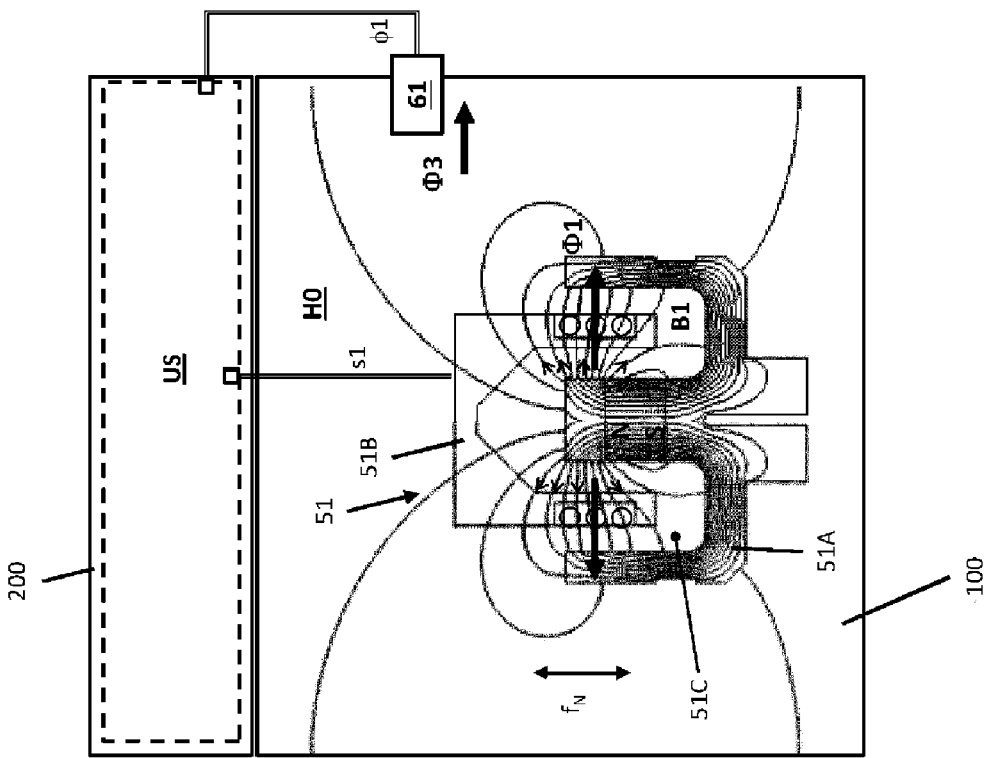
Fig. 4a
Fig. 4b

VIBRONIC MEASURING SYSTEM FOR MEASURING A MASS FLOW RATE OF A FLUID MEASUREMENT MEDIUM

CROSS-REFERENCE TO RELATED APPLICATIONS

The present application is related to and claims the priority benefit of DPMA Patent Application No. 10 2019 133 610.4, filed on Dec. 9, 2019, and International Patent Application No. PCT/EP2020/082907, filed Nov. 20, 2020, the entire contents of which are incorporated herein by reference.

TECHNICAL FIELD

The invention relates to a vibronic measuring system, especially a Coriolis mass-flow-rate measuring device, for measuring a mass flow rate of a fluid measurement medium.

BACKGROUND

In industrial measurement technology, especially also in connection with the regulation and monitoring of automated process-engineering processes, vibronic measuring systems respectively formed by means of a measurement electronics usually formed by means of at least one microprocessor, and a vibration-type measuring sensor electrically connected to said measuring-system electronics and flowed through during operation by the measurement medium to be measured are often used for the highly accurate determination of one or more measurement variables, e.g., a mass flow rate and/or a density, of a measurement medium, e.g., a liquid, a gas or a dispersion, flowing in a process line, e.g., a pipeline. Examples of such measuring systems designed, for example, also as Coriolis mass-flow-rate measuring devices, Coriolis mass-flow-rate/density measuring devices, and/or Coriolis mass-flow-rate/viscosity measuring devices, are inter alia described in EP-A 564 682, EP-A 816 807, US-A 2002/0033043, US-A 2006/0096390, US-A 2007/0062309, US-A 2007/0119264, US-A 2008/0011101, US-A 2008/0047362, US-A 2008/0190195, US-A 2008/0250871, US-A 2010/0005887, US-A 2010/0011882, US-A 2010/0257943, US-A 2011/0161017, US-A 2011/0178738, US-A 2011/0219872, US-A 2011/0265580, US-A 2011/0271756, US-A 2012/0123705, US-A 2013/0042700, US-A 2016/0071639, US-A 2016/0313162, US-A 2016/0187176, US-A 2017/0003156, US-A 2017/0261474, U.S. Pat. Nos. 4,491,009, 4,756,198, 4,777,833, 4,801,897, 4,876,898, 4,996,871, 5,009,109, 5,287,754, 5,291,792, 5,349,872, 5,705,754, 5,796,010, 5,796,011, 5,804,742, 5,831,178, 5,945,609, 5,965,824, 6,006,609, 6,092,429, 6,223,605, 6,311,136, 6,477,901, 6,505,518, 6,513,393, 6,651,513, 6,666,098, 6,711,958, 6,840,109, 6,883,387, 6,920,798, 7,017,424, 7,040,181, 7,077,014, 7,143,655, 7,200,503, 7,216,549, 7,296,484, 7,325,462, 7,360,451, 7,665,369, 7,792,646, 7,954,388, 8,201,460, 8,333,120, 8,695,436, WO-A 00/19175, WO-A 00/34748, WO-A 01/02812, WO-A 01/02816, WO-A 01/71291, WO-A 02/060805, WO-A 2005/050145, WO-A 2005/093381, WO-A 2007/043996, WO-A 2008/013545, WO-A 2008/059262, WO-A 2009/148451, WO-A 2010/099276, WO-A 2013/092104, WO-A 2014/151829, WO-A 2016/058745, WO-A 2017/069749, WO-A 2017/123214, WO-A 2017/137347, WO-A 2017/143579, WO-A 2018/160382, WO-A 2018/174841, WO-A 85/05677, WO-A 88/02853, WO-A 88/03642, WO-A 89/00679, WO-A 94/21999, WO-A 95/03528, WO-A 95/16897, WO-A 95/29385, WO-A 95/29386, WO-A 98/02725, WO-A 99/40 394, WO-A 2018/028932, WO-A 2018/007176, WO-A 2018/007185 oder WO-A 2019/068553.

The measuring sensor of each of the measuring systems shown in said documents comprises at least one vibration element, which is typically designed as a measurement tube that is straight at least in some section and/or is curved, e.g., U-, V-, S-, Z- or Ω-shaped, at least in some sections and has a lumen, surrounded by a tube wall, for conducting the measurement medium, or which, as inter alia also shown in WO-A 2018/160382, US-A 2016/0187176 or WO-A 2019/068553, can also be designed, for example, as a displacement element that is positioned inside a lumen of a tube through which the measurement medium flows. The at least one vibration element is configured to be in contact with the substance to be measured, for example such that the substance to be measured flows through and/or around it, and to be vibrated at the same time, especially in such a way that it carries out useful vibrations, namely mechanical vibrations around a rest position, at a useful frequency also determined by the density of the medium and consequently usable as a measure of the density. In conventional Coriolis mass-flow-rate measuring devices, not least those with a vibration element designed as a measurement tube, bending vibrations at a natural resonant frequency typically serve as useful vibrations, e.g., bending vibrations that correspond to a natural bending vibration fundamental mode that is intrinsic to the measuring sensor and in which the vibrations of the vibration element are resonant vibrations that have precisely one vibration loop. In addition, with a measurement tube that is curved at least in some sections as a vibration element, the useful vibrations are typically designed in such a way that said measurement tube oscillates about an imaginary vibration axis connecting an inlet-side and an outlet-side end of the measurement tube in the manner of a cantilever clamped at one end, whereas in the case of measuring transducers having a straight measurement tube as the vibration element, the useful vibrations are mostly bending vibrations in a single imaginary vibration plane.

It is also known to excite the at least one vibration element occasionally to forced, long-lasting, non-resonant vibrations, for example for the purpose of performing recurrent checks of the measuring transducer during operation of the meter, or else to allow free damped vibrations of the at least one vibration element and to evaluate said free damped vibrations, in order, for instance as described, inter alia, in the aforementioned documents EP-A 816 807, US-A 2011/0178738 or US-A 2012/0123705, to detect, as early as possible, any damage to the at least one vibration element, which can cause an undesired reduction in the measurement accuracy and/or operational reliability of the meter in question.

In the case of measuring transducers having two vibration elements each designed as a measurement tube, these are usually integrated into the respective process line via an inlet-side distributor piece extending between the measurement tubes and an inlet-side connecting flange and via an outlet-side distributor piece extending between the measurement tubes and an outlet-side connecting flange. In the case of measuring transducers having a single measurement tube as a vibration element, the latter usually communicates with the process line via a connecting tube that opens on the inlet side and via a connecting tube that opens on the outlet side. Furthermore, measuring transducers having a single measurement tube as a vibration element each comprise at least one further vibration element, which is specifically designed as a counter-oscillator, for example a tubular, box-shaped or planar counter-oscillator, but which is not in contact with the substance to be measured and which is coupled on the inlet side to the measurement tube to form a first coupling zone and which is coupled on the outlet side to the measurement tube to form a second coupling zone and which substantially rests or oscillates counter to the measurement tube during operation. The inner part of the measuring transducer formed by means of the measurement tube and counter-oscillator is usually held in a protective transducer housing solely by means of the two connecting tubes via which the measurement tube communicates with the process line during operation, especially in a manner allowing vibrations of the inner part relative to the transducer housing. In the case of the measuring sensors shown, for example, in U.S. Pat. Nos. 5,291,792, 5,796,010, 5,945,609, 7,077,014, US-A 2007/0119264, WO-A 01/02 816 or also WO-A 99/40 394, with a single, substantially straight measurement tube, the latter and the counter-oscillator are aligned substantially coaxially with one another, as is quite usual in conventional measuring sensors, in that the counter-oscillator is designed as a substantially straight hollow cylinder and is arranged in the measuring sensor such that the measurement tube is at least partially encased by the counter-oscillator. Comparatively cost-effective steel grades, such as construction steel or machining steel, are generally used as materials for such counter-oscillators, especially also when titanium, tantalum or zirconium are used for the measurement tube.

In order to actively excite or maintain vibrations of the at least one vibration element, not least also the aforementioned useful vibrations, vibration-type measuring transducers furthermore have at least one electromechanical, typically also electrodynamic, vibration exciter acting on the at least one vibration element during operation. The oscillation exciter, which is electrically connected to the aforementioned measuring-system electronics by means of a pair of electric connecting lines, for example in the form of connecting wires and/or in the form of conductor tracks of a flexible printed circuit board, especially serves, when actuated by an electrical driver signal generated by a drive electronics provided in the measuring-system electronics and correspondingly conditioned, namely at least adapted to changing vibration properties of the at least one vibration element, to convert an electrical excitation power fed by means of said driver signal, into a driving force acting on the at least one vibration element at a point of action formed by the oscillation exciter. The drive electronics are especially also configured to adjust the driver signal by means of internal regulation in such a way that it has a signal frequency corresponding to the useful frequency to be excited, occasionally also changing over time, optionally as a vibration amplitude predetermined by an excitation current, specifically an electric current of the driver signal. The driver signal can also, for example, be switched off occasionally during operation of the meter, for example for the purpose of enabling the aforementioned free damped vibrations of the at least one vibration element or, for example, as proposed in the aforementioned document WO-A 2017143579, in order to protect the drive electronics from overloading.

Oscillation exciters of commercially available vibration-type measuring sensors are typically constructed in the manner of a vibration coil that operates according to the electrodynamic principle, namely an air coil-magnet assembly that is formed by means of an air coil, which in the case of measuring sensors having a measurement tube and a counter-oscillator coupled thereto is usually fixed to the latter, namely an air coil that does not enclose a magnetic core but air instead, and a permanent magnet, which interacts with the at least one air coil, serves as an armature and is, for example, correspondingly fixed to the aforementioned measurement tube, and with which assembly the respective air coil is positioned at least partially in an air gap, carrying a magnetic flux, of the permanent magnet. The permanent magnet and air coil are usually oriented in such a way that they extend substantially coaxially with one another and are also configured to be moved relative to one another or in opposite directions in such a way that, when the excitation current flows through the air coil, the permanent magnet and the air coil located in its air gap are moved back and forth substantially translationally. In addition, in conventional measuring transducers, the vibration exciter is usually designed and positioned such that it acts substantially centrally on the at least one measurement tube. As an alternative to an oscillation exciter acting rather centrally and directly on the at least one vibration element, two oscillation exciters fixed on the inlet side or the outlet side of the at least one vibration element rather than in the center of the at least one vibration element can, for example, also be used for the active excitation of mechanical oscillations of the at least one vibration element, as inter alia in the aforementioned document U.S. Pat. No. 6,092,429, or one oscillation exciter acting between the at least one vibration element and the sensor housing can, for example, also be used, as proposed inter alia in U.S. Pat. No. 6,223,605 or 5,531,126.

Due to the useful vibrations of the at least one vibration element, not least also in the case in which the useful vibrations of the at least one vibration element are bending vibrations acting transversely to the flow direction on the flowing measurement medium, Coriolis forces dependent on the instantaneous mass flow rate are also known to be induced in the measurement medium. These forces can in turn cause Coriolis vibrations, dependent on the mass flow rate and superposed on the useful vibrations, of the vibration element, likewise at useful frequency, in such a way that, between inlet-side and outlet-side vibrational movements of the at least one measurement tube that executes the useful vibrations and through which the medium flows at the same time, a propagation time difference or phase difference, also dependent on the mass flow rate and thus also usable as a measure of mass-flow-rate measurement, can be detected. With a measurement tube that is curved at least in some sections as the vibration element, with which a vibration shape in which said measurement tube is allowed to swing in the manner of a cantilever clamped at one end is selected for the useful vibrations, the resulting Coriolis vibrations correspond, for example, to the bending vibration mode, also sometimes referred to as twist mode, in which the measurement tube executes rotary vibrations about an imaginary rotary vibration axis oriented perpendicularly to the mentioned imaginary vibration axis, whereas with a straight measurement tube as the vibration element, the useful vibrations of which are designed as bending vibrations in a single imaginary vibration plane, the Coriolis vibrations are, for example, bending vibrations substantially coplanar with the useful vibrations.

In order to sense both inlet-side and outlet-side vibrational movements of the at least one vibration element, not least also those corresponding to the useful vibrations, and to generate at least two electrical oscillation measurement signals influenced by the mass flow rate to be measured, measuring sensors of the type in question also have two or more vibration sensors that are spaced apart from one another along the at least one vibration element and, for example, are each electrically connected by means of a separate pair of electric connecting lines to a in the aforementioned measuring-system electronics. Each of the vibration sensors is configured to sense the aforementioned vibrational movements at a respective measurement point and to convert them in each case into an electrical oscillation measurement signal that represents said vibrational movements and contains a useful component, namely a (spectral) signal component or namely an AC voltage component at a (signal) frequency corresponding to the useful frequency, and at a (signal) amplitude that is dependent on the useful frequency and on a magnetic flux established in the respective vibration sensor, and to provide said oscillation measurement signal in each case to the measuring-system electronics, for example namely to a measurement and control electronics, formed by means of at least one microprocessor, of the measuring-system electronics for further, possibly also digital processing. In addition, the at least two vibration sensors are designed and arranged such that the aforementioned useful component of the oscillation measurement signals generated therewith each additionally have a phase angle dependent on the mass flow rate, in such a way that a propagation time difference or phase difference dependent on the mass flow rate can be measured between the useful components of the two oscillation measurement signals. Based on said phase difference, the measuring-system electronics repeatedly determines mass-flow-rate measurement values representing the mass flow rate. In addition to measuring the mass flow rate, the density and/or the viscosity of the medium can additionally also be measured, for example based on the useful frequency and/or on an electrical excitation power required for the excitation or maintenance of the useful vibrations or on damping of the useful vibrations determined on the basis thereof, and can be output by the measuring-system electronics together with the measured mass flow rate in the form of qualified measurement values. Typically, the two vibration sensors are designed as electrodynamic vibration sensors, namely especially formed in the same manner as the at least one oscillation exciter by means of, in each case, an air coil-magnet assembly, in this case serving as a plunger coil, in which one air coil is likewise respectively positioned ("immersed") at least partially in an air gap, carrying a magnetic flux, of an associated permanent magnet and with which the air coil and the permanent magnet are additionally configured to be moved relative to one another for the purpose of generating an induction voltage, in such a way that the air coil is moved back and forth substantially translationally in the air gap. The permanent magnet and the air coil are usually aligned in such a way that they extend substantially coaxially with one another.

It is known that, when electrodynamic vibration sensors are used, the aforementioned phase angles of the useful components of each of the oscillation measurement signals can change over time despite a constant mass flow rate or that the phase difference established between the useful components can occasionally have an interference component that is not dependent on the mass flow rate, in such a way that a significant phase error, namely an additional, no longer negligible change in the phase difference, can be observed. Further investigations on conventional vibronic measuring systems, especially namely conventional Coriolis mass-flow-rate measuring devices, have shown that such phase errors can occur especially also in the case that the respective measuring system, especially its respective measuring sensor, is positioned in the vicinity of one or more electric motors, transformers, (electro) magnets, inverters or other types of plant parts carrying high electric currents, especially also direct currents, and is therefore exposed to an occasionally very strong external additional magnetic field, namely one caused outside the measuring system but also propagating inside the measuring sensor thereof.

As also discussed, inter alia, in the aforementioned documents WO-A 01/02812 or U.S. Pat. No. 7,665,369, one possibility for reducing the aforementioned phase error attributable to external magnetic fields consists of, for example, designing the sensor housing using materials having a comparatively high relative magnetic conductivity, for example machining steel or construction steel, such that its effective magnetic resistance is significantly reduced. Another possibility for avoiding measurement errors caused by external magnetic fields would also be, as also proposed in U.S. Pat. No. 7,665,369, to provide, in the respective magnet cups of the vibration sensors, slots suppressing eddy currents caused by external magnetic fields. Investigations have shown, however, that although the aforementioned measures weaken the magnetic fields penetrating into the transducer housing and thereby also contribute to reducing the aforementioned interference component, the phase error cannot always be reduced below a still tolerable level with a reasonable technical complexity, even by combining the two measures. As a result, it cannot easily be ruled out in a conventional Coriolis mass-flow-rate measuring device that, due to an unknown external, possibly also only temporarily established and/or fluctuating, magnetic field, the mass flow rate is measured with significantly increased, undetected measurement errors or corresponding mass-flow-rate measurement values with significantly reduced measurement accuracy are output.

SUMMARY

Proceeding from the aforementioned prior art, an object of the invention consists of improving vibronic measuring systems, not least also Coriolis mass-flow-rate measuring devices, in such a way that the presence of an external magnetic field or its influence on the measurement accuracy can also be at least detected therewith, for example also correspondingly reported in a timely manner.

In order to achieve the object, the invention consists in a vibronic measuring system, e.g., a Coriolis mass-flow-rate measuring device or a Coriolis mass-flow-rate/density measuring device, for measuring a mass flow rate of a fluid measurement medium, e.g., a gas, a liquid or a dispersion, which measuring system comprises:
    a measuring sensor, which has at least one, for example tubular, vibration element, for exciting and maintaining mechanical oscillations of the at least one vibration element, at least one oscillation exciter and, for sensing mechanical oscillations of the at least one vibration element, for example its useful vibrations, an electrodynamic first vibration sensor and at least one electrodynamic second vibration sensor, for example structurally identical to the first vibration sensor, and which is configured to guide the measurement medium, namely to at least intermittently be flowed through by the measurement medium;
    a sensor housing for the measuring sensor, for example with a wall made of a metal;
    for sensing a magnetic field that is established inside the measuring system for example namely a magnetic field that is caused by an electric field generated outside the sensor housing and/or by a magnet positioned outside the sensor housing and/or is constant over time, at least one first magnetic-field detector formed, for example, by means of a Hall sensor and/or a reed switch;

and a measuring-system electronics, which is electrically coupled both to the measuring sensor, namely its at least one oscillation exciter and its first and second vibration sensors, and to the first magnetic-field detector, and which is, for example, formed by means of at least one microprocessor and/or constructed in a modular manner;

wherein the measuring sensor is positioned inside the sensor housing and the first magnetic-field detector is positioned outside the sensor housing, for example in such a way that the at least one vibration element is held on the sensor housing and/or that the first magnetic-field detector is attached to the outside of the sensor housing;

wherein the at least one vibration element is configured to be contacted by the flowing measurement medium and to be allowed to vibrate at the same time;

wherein the at least one oscillation exciter is configured to convert electrical power fed to the oscillation exciter into mechanical power causing forced mechanical oscillations of the vibration element;

wherein the measuring-system electronics is configured to generate an electrical driver signal and to feed electrical power into the at least one oscillation exciter by means of the driver signal, in such a way that the vibration element executes at least proportionally useful vibrations, namely forced mechanical oscillations at at least one useful frequency, namely an oscillation frequency specified by the electrical driver signal and, for example, corresponding to a resonant frequency of the measuring sensor, which useful vibrations are suitable for causing, in the flowing measurement medium, Coriolis forces dependent on the mass flow rate;

wherein the first vibration sensor is configured to convert vibrational movements of the at least one vibration element at a first measurement point into an electrical first oscillation measurement signal of the measuring sensor in such a way that said first oscillation measurement signal has at least one first useful component, namely an AC voltage component at a frequency corresponding to the useful frequency, and with an amplitude dependent on the useful frequency and a first magnetic flux, namely a magnetic flux through the first vibration sensor;

wherein the second vibration sensor is configured to convert vibrational movements of the at least one vibration element at a measurement point remote from the first measurement point into an electrical second oscillation measurement signal of the measuring sensor in such a way that said second oscillation measurement signal has at least one second useful component, namely an AC voltage component at a frequency corresponding to the useful frequency, and with a amplitude dependent on the useful frequency and a second magnetic flux, namely a magnetic flux through the second vibration sensor;

wherein the first magnetic-field detector is configured to sense the magnetic field at a third measurement point located outside the sensor housing and to convert the magnetic field into a first magnetic-field signal, which, for example, evaluates and/or quantifies said magnetic field and/or is electrical and which has an amplitude dependent on a third magnetic flux, namely a magnetic flux through the first magnetic-field detector, and/or on an area density of said magnetic flux, for example in such a way that the first magnetic-field signal follows at least a change in the third magnetic flux and/or in its area density with a change in the amplitude;

and wherein the measuring-system electronics is configured to receive and evaluate both the first and second oscillation measurement signals and at least the first magnetic-field signal, namely to determine, on the basis of the first and second oscillation measurement signals, mass-flow-rate measurements, which represent the mass flow rate and are, for example, digital, namely to output them to a signal output, and to determine, on the basis of the first magnetic-field signal, at least qualitatively whether and/or to what extent the magnetic field is established at the first and/or second measurement points and/or contributes to the first and/or second magnetic fluxes, and/or to determine whether a disturbance of the measuring system, which, for example, reduces the functionality of the measuring system and/or causes a malfunction of the measuring system and/or reduces an integrity of at least one of the first and second oscillation measurement signals or the mass-flow-rate measurement values obtained therefrom, by said magnetic field is present.

According to a first embodiment of the invention, it is furthermore provided that the first magnetic-field signal is an analog signal, e.g., a continuous-value and continuous-time analog signal, for example with a voltage dependent on the third magnetic flux and/or on the area density thereof. In a development of this embodiment of the invention, the measuring-system electronics is furthermore configured to calculate, on the basis of the first magnetic-field signal, characteristic number values for at least one magnetic-field characteristic number characterizing, for example, an influence on the measuring sensor by the external magnetic field and/or an influence on at least one of the first and second magnetic fluxes, for example in such a way that said magnetic-field characteristic number is dependent on a deviation of the first magnetic flux from the second magnetic flux and/or evaluates and/or quantifies said deviation or that said magnetic-field characteristic number is dependent on a deviation of the first magnetic flux from a reference value determined in advance and/or evaluates and/or quantifies said deviation.

According to a second embodiment of the invention, it is furthermore provided that the first magnetic-field signal is an analog signal, e.g., a continuous-value and continuous-time analog signal, for example with a voltage dependent on the third magnetic flux and/or on the area density thereof and that the measuring-system electronics is also configured to compare one or more characteristic number values for the magnetic-field characteristic number in each case to one or more reference values determined for the magnetic-field characteristic number, for example by the manufacturer of the Coriolis mass-flow-rate measuring device and/or during the production of the Coriolis mass-flow-rate measuring device, and/or to one or more reference values representing a malfunction of the measuring sensor and/or to one or more reference values representing a Coriolis mass-flow-rate measuring device that is no longer intact. In a development of this embodiment of the invention, the measuring-system electronics is also configured to determine whether one or more characteristic number values for the magnetic-field characteristic number is greater than the at least one reference value for the magnetic-field characteristic number, for example namely if one or more characteristic number values for the magnetic-field characteristic number are greater than one or more reference values representing a reduced functionality of the measuring sensor and/or are greater than one or more reference values representing a malfunction of the measuring sensor and/or are greater than one or more reference values representing a Coriolis mass-flow-rate measuring device that is no longer intact, to output a message indicating this.

According to a third embodiment of the invention, it is furthermore provided for the measuring-system electronics to have a non-volatile electronic data memory that is configured to store digital data, e.g., even without an applied operating voltage, especially namely to store one or more reference values determined in advance for the magnetic-field characteristic number. In a development of this embodiment of the invention, one or more reference values, determined, for example, in advance by the manufacturer of the measuring system and/or during production of the measuring system and/or during operation of the measuring system, for the magnetic-field characteristic number, for example namely one or more reference values representing a reduced functionality of the measuring sensor, and/or namely one or more reference values representing a malfunction of the measuring sensor, are stored in the electronic data memory. In addition, the measuring-system electronics can possibly also be configured to compare one or more characteristic number values for the magnetic-field characteristic number in each case to one or more reference values stored in the data memory for the magnetic-field characteristic number.

According to a fourth embodiment of the invention, it is furthermore provided that the first magnetic-field detector is formed by means of at least one Hall sensor.

According to a fifth embodiment of the invention, it is furthermore provided that the first magnetic-field detector is formed by means of at least one reed switch.

According to a sixth embodiment of the invention, it is furthermore provided that the first magnetic-field detector is positioned less far away from the first vibration sensor than from the second vibration sensor and/or less than 5 cm away from the first vibration sensor.

According to a seventh embodiment of the invention, the measurement and control electronics have a first analog to digital converter for the first vibration measurement signal and a second analog to digital converter for the second vibration measurement signal. In a development of this embodiment of the invention, the measuring-system electronics furthermore has a third analog-to-digital converter for the first magnetic-field signal.

According to an eighth embodiment of the invention, it is furthermore provided that the first vibration sensor is formed by means of a first plunger coil and the second vibration sensor is formed by means of a second plunger coil.

According to a ninth embodiment of the invention, it is furthermore provided that the first vibration sensor has a first permanent magnet, which is, for example, mechanically connected to the at least one vibration element to form the first measurement point, and a first air coil in such a way that the first permanent magnet forms a first air gap carrying the first magnetic flux, and the first air coil is positioned at least partially inside said first air gap, and that the first permanent magnet and the first air coil are configured to be moved relative to one another by vibrational movements of the at least one vibration element and to generate a first induction voltage serving as first oscillation measurement signal. It is furthermore provided that the second vibration sensor has a second permanent magnet, which is, for example, mechanically connected to the at least one vibration element to form the second measurement point, and a second air coil in such a way that the second permanent magnet forms a second air gap carrying the second magnetic flux, and the second air coil is positioned at least partially inside said second air gap, and that the second permanent magnet and the second air coil are configured to be moved relative to one another by vibrational movements of the at least one vibration element and to generate a second induction voltage serving as second oscillation measurement signal.

According to a tenth embodiment of the invention, it is furthermore provided that each of the first and second useful components respectively has a phase angle dependent on the mass flow rate. In a development of this embodiment of the invention, the measuring-system electronics is furthermore configured to calculate the mass-flow-rate measurement values on the basis of a phase difference between the first and second useful components, namely a difference between the phase angle of the first useful component and the phase angle of the second useful component.

According to an eleventh embodiment of the invention, it is furthermore provided that the at least one vibration element is formed by means of at least one tube, which is, for example, straight at least in some sections and/or arcuate at least in some sections, with one of a tube wall, e.g., a metallic tube wall, and a lumen surrounded by said tube wall and is configured to be flowed through by the measurement medium and to be allowed to vibrate in the meantime.

According to a twelfth embodiment of the invention, it is provided that the measuring-system electronics is designed in a modular manner in such a way that the measuring-system electronics has a first electronics module and a second electronics module. A development of this embodiment of the invention furthermore provides that the first electronics module is configured both to generate the driver signal and to receive and evaluate the first and second oscillation measurement signals and that the second electronics module is configured to receive and evaluate the first magnetic-field signal. Alternatively or in addition, the first and second electronics modules of the measuring-system electronics can be electrically coupled to one another, for example in such a way that a signal output of the first electronics module is electrically connected to a signal input of the second electronics module.

According to a first development of the invention, it is provided that the measuring system furthermore comprises at least one electronics housing, for example constructed in a modular manner, wherein the measuring-system electronics is accommodated at least partially, for example completely, inside the electronics housing and/or wherein the first magnetic-field detector is positioned outside the electronics housing. According to one embodiment of this development, it is furthermore provided that the sensor housing additionally has a connection piece for the electronics housing, and that the electronics housing is mechanically connected, for example, releasably, to the connection piece.

According to a second development of the invention, it is provided that the measuring system furthermore comprises at least one modularly constructed electronics housing inside of which the measuring-system electronics is at least partially, for example completely, accommodated, in such a way that the electronics housing has a first housing module and a second one has a first housing module. A development of this embodiment of the invention furthermore provides that the first housing module is attached to the outside of the sensor housing and/or that the second housing module is attached to the outside of the first housing module.

According to a third development of the invention, it is provided that the measuring system furthermore comprises at least one modularly constructed electronics housing inside of which the measuring-system electronics is at least partially, for example completely, accommodated, in such a way that the electronics housing has a first housing module and a second one has a first housing module, and that the measuring-system electronics is designed in a modular manner in such a way that the measuring-system electronics has a first electronics modules and a second electronics module. According to one embodiment of this development, it is furthermore provided that the first housing module of the electronics housing is configured to receive the first electronics module of the measuring-system electronics, and that the second housing module of the electronics housing is configured to receive the second electronics module of the measuring-system electronics, and it is additionally provided that the electronics module is accommodated inside the first housing module and the second electronics module is accommodated inside the second housing module. The first electronics module can, for example, be configured both to generate the driver signal and to receive and evaluate the first and second oscillation measurement signals, and the second electronics module can in addition be configured to receive and evaluate the first magnetic-field signal. Alternatively or in addition, the first and second electronics modules of the measuring-system electronics can be electrically coupled to one another, for example in such a way that a signal output of the first electronics module is electrically connected to a signal input of the second electronics module.

According to a fourth development of the invention, it is provided that the measuring system furthermore comprises a, for example metallic, protective shield for the at least one magnetic-field detector, wherein the protective shield is positioned outside the sensor housing, for example namely attached to the outside of the sensor housing to form an intermediate space located between the protective shield and the sensor housing, and wherein the magnetic-field detector is positioned inside said intermediate space. According to one embodiment of this development, it is furthermore provided that the protective shield is at least partially made of a stainless steel and/or that the protective shield is firmly bonded to the sensor housing, for example namely welded thereto, and/or that the protective shield is secured to the sensor housing by means of at least one seal.

According to a fifth development of the invention, it is provided that the measuring system for sensing the magnetic field comprises at least one second magnetic-field detector, which is formed, for example, by means of a Hall sensor and/or a reed switch and/or is structurally identical to the first magnetic-field detector, wherein the second magnetic-field detector is configured to sense the magnetic field at a fourth measurement point remote from the third measurement point, for example namely also remote from the first measurement point and/or from the second measurement point and/or located outside the sensor housing, and to convert it into a second magnetic-field signal, which, for example, evaluates and/or quantifies the magnetic field and/or is electric and which has an amplitude dependent on a fourth magnetic flux, namely a magnetic flux through the second magnetic-field detector, and/or on an area density of said magnetic flux; this, for example, in such a way that the second magnetic-field signal follows at least a change in the fourth magnetic flux and/or in its area density with a change in the amplitude. In addition, the measuring-system electronics is furthermore configured to also receive and evaluate the second magnetic-field signal, namely to determine on the basis of also the second magnetic-field signal whether the external magnetic field is present. According to one embodiment of this development of the invention, it is furthermore provided that the second magnetic-field detector is positioned in the vicinity of the second vibration sensor, for example namely less than 5 cm away, and/or that the second magnetic-field signal is an analog signal, for example with a voltage dependent on the fourth magnetic flux and/or its area density, and/or that the second magnetic-field detector is also positioned outside the sensor housing, for example in such a way that the second magnetic-field detector is attached on the outside of the sensor housing (100).

A basic idea of the invention is to decidedly sense, and possibly correspondingly report, by means of at least one additional magnetic-field detector positioned outside the respective sensor housing, an influence, occasionally occurring by external magnetic fields, on the vibration sensors of vibronic measuring systems, especially designed as Coriolis mass-flow-rate measuring devices, or of their oscillation measurement signals. An advantage of the invention consists, inter alia, in that existing measuring systems, not least also already installed measuring systems, can thus also be easily retrofitted.

The invention as well as advantageous embodiments thereof are explained in more detail below based on exemplary embodiments shown in the figures of the drawing. Identical or identically acting or identically functioning parts are provided with the same reference signs in all figures; for reasons of clarity or if it appears sensible for other reasons, reference signs mentioned before are dispensed with in subsequent figures. Further advantageous embodiments or developments, especially combinations of partial aspects of the invention that were initially explained only separately, furthermore result from the figures of the drawing and/or from the claims themselves.

BRIEF DESCRIPTION OF THE DRAWINGS

The figures show in detail:

FIG. 4a, 4b shows a schematic representation respectively of a vibration sensor and a magnetic-field sensing device of a measuring sensor according to FIG. 2, and field lines of a magnetic field penetrating the measuring sensor in each case;

DETAILED DESCRIPTION

Figure 1:
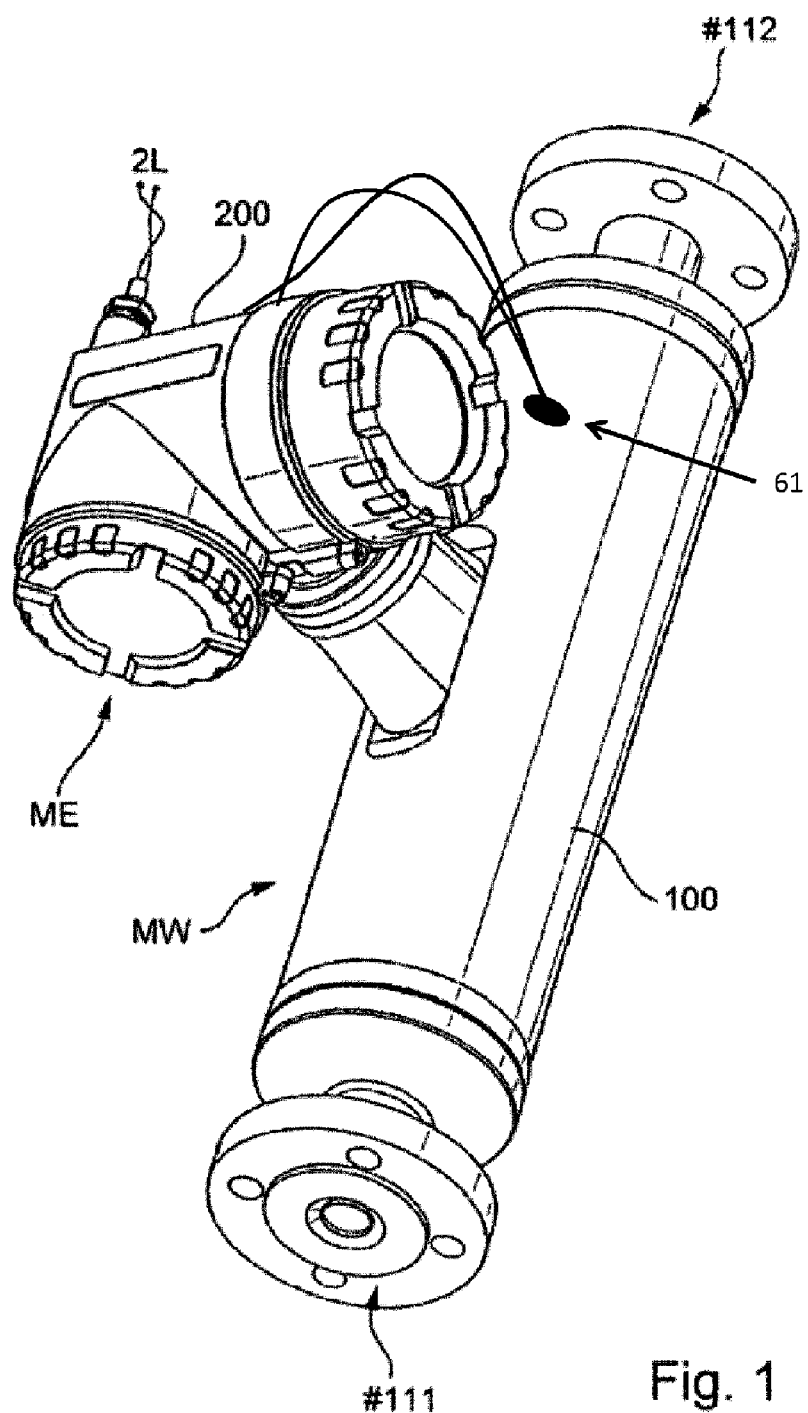
FIG. 1 shows a vibronic measuring system formed here by means of a Coriolis mass-flow-rate measuring device.
Figure 2:
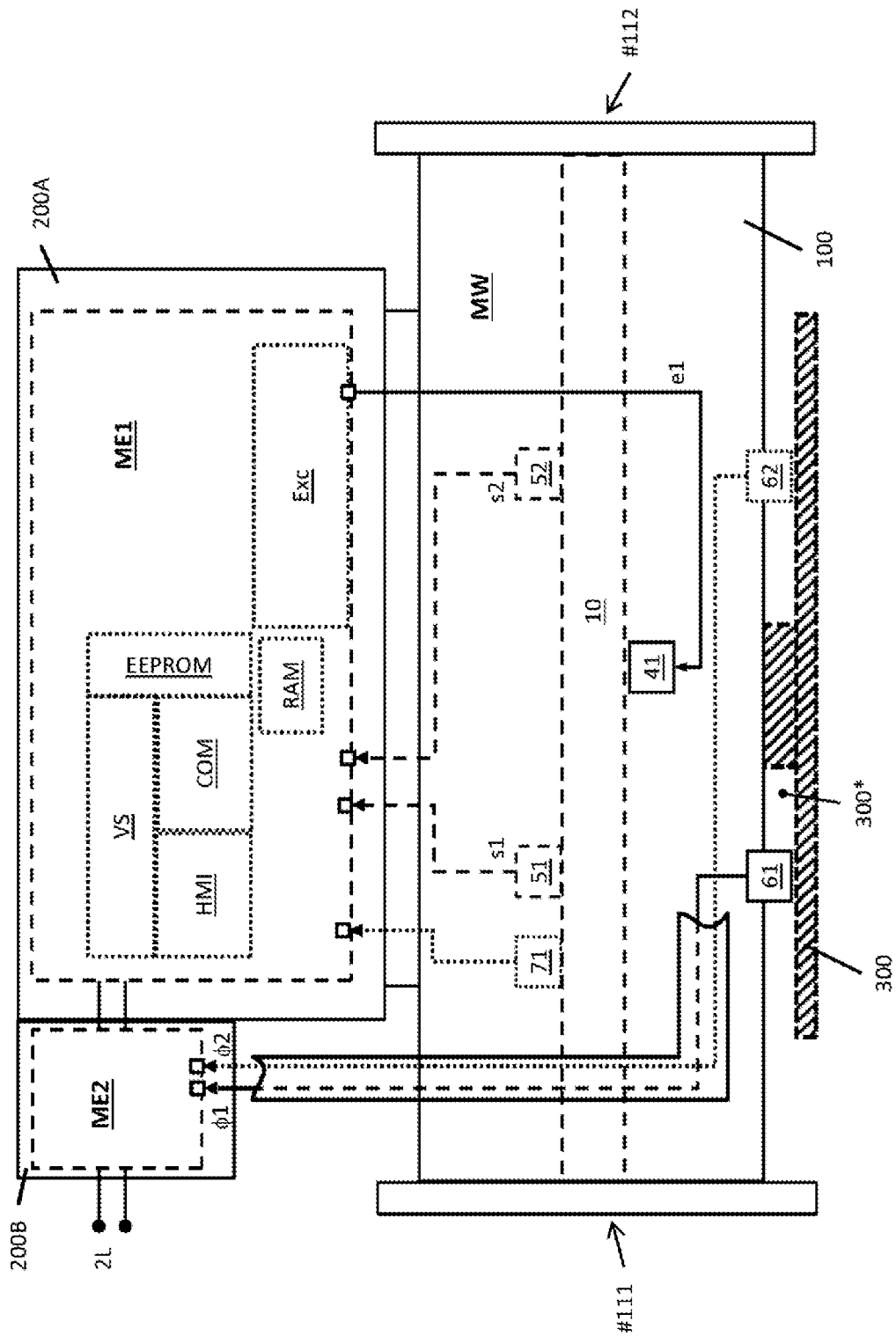
FIG. 2 shows a schematic representation, in the manner of a block diagram, a measuring-system electronics, especially also suitable for measuring device according to FIG. 1, with a vibration-type measuring sensor connected thereto or a Coriolis mass-flow-rate measuring device according to FIG. 1.

FIGS. 1 and 2 show a vibronic measuring system that can be inserted into a process line (not shown here), such as a pipeline of an industrial plant, for example of a filling plant or a refueling device, for flowable measurement media, especially fluid or pourable measurement media, for example namely also a fluid that is at least intermittently 2-phase or multi-phase or inhomogeneous. The measuring system serves especially for measuring and/or monitoring a mass flow rate m or for determining mass-flow-rate measurement values, representing the mass flow rate, of a fluid measurement medium conducted in the aforementioned process line or at least intermittently allowed to flow therein, for example namely a gas, a liquid or a dispersion. Furthermore, the measuring system can serve to additionally also measure a density ρ and/or a viscosity η of the measurement medium, for example namely to determine and output the density measurement values representing the density and/or the viscosity measurement values representing the viscosity. According to one embodiment of the invention, it is provided to use the measuring system for determining mass-flow-rate measurement values of a measurement medium that is to be transferred, for example namely to be delivered in a specified or specifiable amount by a supplier to a customer, for example a liquefied gas, such as a liquid gas containing methane and/or ethane and/or propane and/or butane, or a liquefied natural gas (LNG), or also a mixture of substances formed by means of liquid hydrocarbons, for example namely a petroleum or a liquid fuel. The measuring system can accordingly also be designed, for example, as a component of a transfer point for freight traffic subject to calibration obligations, such as a refueling plant, and/or as a component of a transfer point, for example also in the manner of the transfer points disclosed in the mentioned documents WO-A 02/060805, WO-A 2008/013545, WO-A 2010/099276, WO-A 2014/151829, WO-A 2016/058745.

The measuring system, which is implemented, for example, as a Coriolis mass-flow-rate measuring device or as a Coriolis mass-flow-rate/density measuring device additionally measuring the density and/or as a Coriolis mass-flow-rate/viscosity measuring device additionally measuring the viscosity, comprises a physical-electric measuring sensor MW, which is connected to the process line via an inlet end #111 and an outlet end #112 and is configured to be flowed through by the measurement medium during operation, and an electronic measuring-system electronics ME, which is electrically coupled to said measuring sensor and is especially formed by means of at least one microprocessor and/or is supplied with electrical energy during operation by means of internal energy stores and/or externally via connecting cables. The electric coupling or connection of the measuring sensor MW to the measuring-system electronics ME can take place by means of corresponding electric connecting lines and corresponding cable feedthroughs. In this case, the connecting lines can be formed at least proportionally as electric conducting wires surrounded at least in some sections by electric insulation, for example in the form of "twisted pair" lines, ribbon cables and/or coaxial cables. As an alternative or in addition thereto, the connecting lines can also be formed at least in some sections by means of printed conductors of a printed circuit board, especially a flexible, optionally varnished printed circuit board.

Advantageously, the measuring-system electronics ME, which is, for example, also programmable and/or able to be remotely parametrized, can furthermore be designed such that, during operation of the measuring system, it can exchange measurement data and/or other operating data, for example also status messages, such as current measurement values or setting values and/or diagnostic values serving to control the measuring system, with a higher-level electronic data processing system (not shown here), e.g., a programmable logic controller (PLC), a personal computer, and/or a workstation, via a data transmission system, e.g., a field bus system and/or a wireless radio connection. Accordingly, the measuring-system electronics ME can have, for example, a transmitting and receiving electronics COM that is fed during operation by a (central) evaluation and supply unit provided in the aforementioned data processing system and remote from the measuring system. For example, the measuring-system electronics ME (or its aforementioned transmitting and receiving electronics COM) can be designed such that it can be connected electrically to the aforementioned external electronic data processing system via a two-conductor connection 2L, optionally also configured as a 4-20 mA current loop, and, via said connection, can both obtain the electrical power required for operating the measuring system from the aforementioned evaluation and supply unit of the data processing system and transmit measurement values to the data processing system, for example by (load) modulation of a direct supply current fed by the evaluation and supply unit. In addition, the measuring-system electronics ME can also be designed such that it can be operated nominally at a maximum power of 1 W or less and/or is intrinsically safe. The measuring-system electronics 20 of the measuring system according to the invention can also, for example, be of modular construction in such a way that various electronic components of the measuring-system electronics ME, such as drive electronics Exc for actuating the measuring sensor, a measurement and control electronics DSV for processing measurement signals provided by the measuring sensor and for determining measurement values on the basis of measurement signals of the measuring sensor, an internal power supply circuit VS for providing one or more internal operating voltages, and/or the aforementioned transmitting and receiving electronics COM serving for communication with a higher-level measurement data processing system or an external field bus, respectively arranged on a separate printed circuit board and/or respectively formed by means of a separate microprocessor. Accordingly, according to a further embodiment of the invention, the measuring-system electronics ME is of modular design in such a way that the measuring-system electronics ME has a first electronics module ME1 and a second electronics module ME2 electrically coupled thereto, for example namely by means of electrical connecting lines; this, for example, in such a way that a signal output of the electronics module ME1 is electrically connected to a signal input of the electronics module ME2. The aforementioned signal output of the electronics module ME1 can be designed, for example, to output digital measurement values determined on the basis of measurement signals of the measuring sensor, especially namely the aforementioned mass-flow-rate, density or viscosity measurement values. In order to visualize measurement values generated internally by the measuring system and/or status messages generated internally by the measuring system, such as an error message or an alarm, on site, the measuring system can furthermore have a display and operating element HMI, such as an LCD, OLED or TFT display positioned in the aforementioned electronics housing 200 behind a window provided correspondingly therein, which HMI also communicates at least intermittently with the measuring-system electronics 20, for example namely with the aforementioned measurement and control electronics DSV thereof, and a corresponding input keyboard and/or a touchscreen.

In order to protect the measuring-system electronics ME, the measuring system according to a further embodiment of the invention has an electronics housing 200, for example also constructed in a modular manner, and the measuring-system electronics ME is accommodated at least partially, possibly also completely, inside said electronics housing 200. According to a further embodiment of the invention, the electronics housing 200 is of modular design in such a way that the electronics housing 200 has a first housing module 200A and a second housing module 200B, which is mechanically connected, for example, directly to said housing module 200A. For the aforementioned case that the measuring-system electronics ME is formed by means of two electronics modules ME1, ME2, the housing module 200A can furthermore be configured to receive the electronics module ME1, and the housing module 200B can accordingly be configured to receive the electronics module ME2. The electronics housing 200 or a respective housing module thereof can, for example, be produced from a metal, such as stainless steel or aluminum, and/or by means of a casting method, such as an investment casting or die casting method (HPDC); it can however, for example, also be formed by means of a plastic molded part produced in an injection-molding method. In addition, the electronics housing 200 or the aforementioned housing modules can also be designed to be resistant to impact or pressure and/or to protect against penetration of dust in damaging amounts and/or spray water on all sides, for example also in such a way that it meets the requirements of protection class IP 54 according to DIN EN 60529 (VDE 0470-1):2014-09 and/or the requirements of the ignition protection type "Pressure-Resistant Enclosure (Ex-d)" according to EN 60079-1:2007.

The measuring sensor MW is, as already indicated, a vibration-type measuring sensor, namely a measuring sensor with at least one vibration element 10, with at least one electromechanical oscillation exciter 41 for exciting and maintaining mechanical oscillations of the at least one vibration element 10 and with an electrodynamic first vibration sensor 51 and at least one electrodynamic second vibration sensor 52, which is, for example, structurally identical to the first vibration sensor 51, for sensing mechanical oscillations of the at least one vibration element 10, wherein both the oscillation exciter 41 and the vibration sensors 51, 52 are each electrically coupled to the measuring-system electronics 20, and wherein the at least one vibration element 10 is configured to be contacted by flowing measurement medium, for example namely to be flowed through and/or flowed around by the measurement medium and to be allowed to vibrate meanwhile, for example namely at at least one resonant frequency inherent in the vibration element or the measuring sensor formed therewith, for example namely with at least one resonant frequency inherent in the vibration element or the measuring sensor formed therewith. The measuring sensor can accordingly also be, for example, a conventional vibration-type measuring sensor, for example namely also a measuring sensor known from the aforementioned documents EP-A 816 807, US-A 2002/0033043, US-A 2006/0096390, US-A 2007/0062309, US-A 2007/0119264, US-A 2008/0011101, US-A 2008/0047362, US-A 2008/0190195, US-A 2008/0250871, US-A 2010/0005887, US-A 2010/0011882, US-A 2010/0257943, US-A 2011/0161017, US-A 2011/0178738, US-A 2011/0219872, US-A 2011/0265580, US-A 2011/0271756, US-A 2012/0123705, US-A 2013/0042700, US-A 2016/0313162, US-A 2017/0261474, U.S. Pat. Nos. 4,491,009, 4,756,198, 4,777,833, 4,801,897, 4,876,898, 4,996,871, 5,009,109, 5,287,754, 5,291,792, 5,349,872, 5,705,754, 5,796,010, 5,796,011, 5,804,742, 5,831,178, 5,945,609, 5,965,824, 6,006,609, 6,092,429, 6,223,605, 6,311,136, 6,477,901, 6,505,518, 6,513,393, 6,651,513, 6,666,098, 6,711,958, 6,840,109, 6,920,798, 7,017,424, 7,040,181, 7,077,014, 7,200,503, 7,216,549, 7,296,484, 7,325,462, 7,360,451, 7,792,646, 7,954,388, 8,333,120, 8,695,436, WO-A 00/19175, WO-A 00/34748, WO-A 01/02816, WO-A 01/71291, WO-A 02/060805, WO-A 2005/093381, WO-A 2007/043996, WO-A 2008/013545, WO-A 2008/059262, WO-A 2010/099276, WO-A 2013/092104, WO-A 2014/151829, WO-A 2016/058745, WO-A 2017/069749, WO-A 2017/123214, WO-A 2017/143579, WO-A 85/05677, WO-A 88/02853, WO-A 89/00679, WO-A 94/21999, WO-A 95/03528, WO-A 95/16897, WO-A 95/29385, WO-A 98/02725, WO-A 99/40 394 or PCT/EP2017/067826.

The at least one vibration element 10 is, as indicated in FIG. 2 or is readily apparent from a combination of FIGS. 1 and 2, together with the at least one oscillation exciter 41 and the at least two vibration sensors 51, 52 and possibly further components of the measuring sensor MW, accommodated inside a sensor housing 100 of the measuring system; this especially in such a way that the at least one vibration element 10 is held on the sensor housing 100, for example namely is rigidly connected to the sensor housing 100. According to a further embodiment of the invention, said sensor housing 100 has a wall made of a metal, for example namely a stainless steel. In addition, as also illustrated in FIGS. 1 and 2, the aforementioned electronics housing 200 can, for example, be mounted on said sensor housing 100 in a compact construction in order to form a mass-flow-rate measuring device for example namely a Coriolis mass-flow-rate measuring device. Accordingly, according to a further embodiment of the invention, the sensor housing 100 has a connection piece for the electronics housing and the electronics housing 200 is mechanically connected, possibly also releasably, to the connection piece. For the aforementioned case in which the electronics housing 200 is of modular design, the housing module 200A can especially be attached to the outside of the sensor housing 100, for example in such a way that the housing module 200A is attached to the outside of the sensor housing 100 and that the housing module 200B is attached to the outside of the housing module 200A.

As is customary in the case of measuring sensors of the type in question and vibronic measuring systems formed therewith, the vibration element 10 can also be formed, for example, by means of one or more tubes, especially tubes that are straight at least in some sections and/or arcuate at least in some sections, with one of a tube wall, especially a metallic tube wall, and a lumen surrounded by said tube wall, wherein the tube or each of the tubes is also respectively configured to carry the at least intermittently flowing fluid measurement medium (or to be flowed through by said measurement medium) and to be allowed to vibrate correspondingly meanwhile. However, the vibration element can also be formed, for example, by means of one or more displacement elements positioned inside a lumen of a tube of a tube of the measuring transducer through which the substance to be measured flows, the displacement element or each of the displacement elements being respectively configured such that the substance to be measured flows around them they are vibrated correspondingly at the same time.

The at least one oscillation exciter 41 in turn is configured to convert electrical power fed thereto into mechanical power causing forced mechanical oscillations of the at least one vibration element 11. According to a further embodiment of the invention, the at least one oscillation exciter 41, which is designed, for example, as an electrodynamic, electromagnetic or piezoelectric, oscillation exciter 41, as also indicated in FIG. 2 and quite common in vibration-type measuring sensors or vibronic measuring systems formed therewith, is positioned such that a force generated therewith acts on the vibration element in the direction of an imaginary force action line extending through a center of mass of the at least one vibration element, and/or that the oscillation exciter 41, as also shown in FIG. 2, is the only oscillation exciter causing oscillations of the vibration element 10.

The measuring-system electronics ME of the measuring system according to the invention is also, inter alia, provided and correspondingly configured to generate an electrical driver signal e1, e.g., a bipolar and/or at least intermittently periodic, possibly also harmonic electrical driver signal, and to thus feed electrical power into the at least one oscillation exciter 41, in such a way that the at least one vibration element 10 executes at least proportionally useful vibrations, namely forced mechanical oscillations at a useful frequency $f_N$, which useful vibrations are suitable for producing Coriolis forces, which are dependent on the mass flow rate and act on the vibration element 10, in the flowing measurement medium in such a way that Coriolis vibrations, namely mechanical oscillations additionally forced by the Coriolis forces and dependent on the mass flow rate m of the measurement medium, are superposed on the aforementioned useful vibrations at the useful frequency $f_N$. The useful frequency $f_N$ is a vibration frequency of the forced mechanical vibrations of the vibration element that is predetermined by the electric driver signal e1 and for example corresponds to the aforementioned resonant frequency $f_R$ of the measuring transducer ($f_N = f_R$). The driver signal e1 can accordingly be, for example, a harmonic electric signal that forms the aforementioned signal component $e1_N$ determining the useful frequency $f_N$ or, for example, also a multi-frequency electric signal that is composed of multiple (spectral) signal components and contains a spectral useful component $e1_N$ determining the useful frequency $f_N$. The useful vibrations excited by means of the oscillation exciter 41 and the measuring-system electronics ME connected thereto can furthermore, for example, be bending vibrations of the at least one vibration element 10 about an associated rest position, wherein, for example, an instantaneous resonant frequency, also dependent on the density and/or viscosity of the measurement medium conducted in the measuring sensor and in contact with the vibration element 10 thereof, of a bending vibration fundamental mode, having only a single vibration loop, of the at least one vibration element 10 and/or a lowest instantaneous resonant frequency of the at least one vibration element 10 can be selected, namely set by means of the driver signal e1, as the useful frequency $f_N$. In order to generate the driver signal e1 or to set the useful frequency $f_N$, the measuring-system electronics ME can have, for example, a corresponding drive electronics Exc, especially formed by means of one or more phase-locked loops (PLL) serving to determine and set the useful frequency $f_N$. According to a further embodiment of the invention, the drive electronics Exc has a digital frequency output. In addition, the drive electronics Exc are also configured to output at said frequency output a frequency sequence, specifically a sequence of digital frequency values that quantify the signal frequency set for the driver signal e1, for example specifically the currently set useful frequency (or the signal frequency of its signal component eN1).

Figure 3:
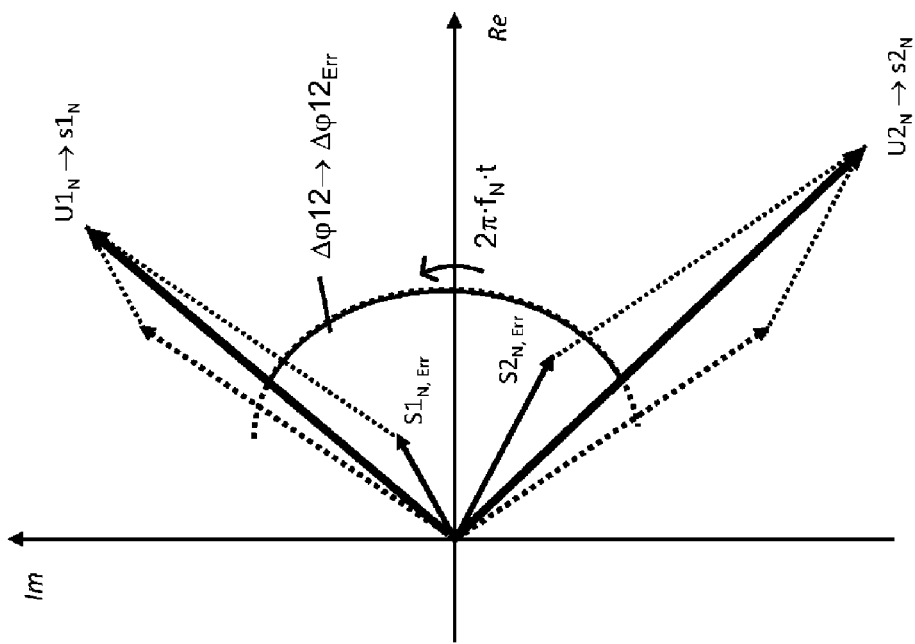
FIG. 3 shows a phasor diagram (vector diagram with static vectors) for signal components of oscillation measurement signals generated by means of a Coriolis mass-flow-rate measuring device according to FIG. 1 or by means of a measuring-system electronics, connected to a vibration-type measuring sensor, according to FIG. 2.

As already mentioned, the measuring sensor MW is furthermore also equipped with electrodynamic vibration sensors 51, 52 in order to sense mechanical oscillations of the at least one vibration element 11, not least also forced mechanical oscillations of the at least one vibration element 11, wherein the vibration sensor 51 can be formed, for example, by means of a first plunger coil and the vibration sensor 52 can be formed, for example, by means of a second plunger coil. Especially, the vibration sensor 51 is configured to convert vibrational movements of the at least one vibration element 11 at a first measurement point into an electrical first oscillation measurement signal s1 of the measuring sensor in such a way that, as also indicated in FIG. 3, said oscillation measurement signal s1 has at least one first useful component $s1_N$ (dependent on the time t), namely an AC voltage component at a frequency corresponding to the useful frequency $f_N$, and the vibration sensor 52 is configured to convert vibrational movements of the at least one vibration element at a second measurement point, remote from the first measurement point, into an electrical second oscillation measurement signal s2 of the measuring sensor in such a way that, as also indicated in FIG. 3, said oscillation measurement signal s2 has at least one second useful component $s2_N$ (dependent on the time t), namely an AC voltage component at a frequency corresponding to the useful frequency $f_N$. Given that each of the two vibration sensors 51, 52 is an electrodynamic vibration sensor, the useful component $s1_N$ accordingly has an amplitude $U1_N$ (or dependent voltage level) depending on the useful frequency $f_N$ and on a first magnetic flux $\Phi 1$, namely a magnetic flux through the vibration sensor 51, and the useful component $s2_N$ accordingly has an amplitude $U2_N$ (or dependent voltage level) depending on the useful frequency $f_N$ and on a second magnetic flux $\Phi 2$, namely a magnetic flux through the vibration sensor 52. Each of the two vibration sensors can, as is quite usual in measuring sensors of the type in question, be formed, for example, by means of a plunger coil. Accordingly, according to a further embodiment of the invention, it is provided that the first vibration sensor has a first permanent magnet, for example namely mechanically connected to the at least one vibration element to form the first measurement point, and a first air coil, for example mechanically connected to the at least one vibration element 11 and/or to the sensor housing 100, and that the second vibration sensor has a second permanent magnet, for example namely mechanically connected to the at least one vibration element 11 to form the second measurement point, and a second air coil, for example mechanically connected to the at least one vibration element and/or to the sensor housing 100. The first permanent magnet forms a first air gap that carries the magnetic flux $\Phi 1$ and inside of which the first air coil is at least partially positioned, and the second permanent magnet forms a second air gap that carries the magnetic flux $\Phi 2$ and inside of which the second air coil is at least partially positioned. Furthermore, the first permanent magnet and the first air coil are configured to be moved relative to one another by vibrational movements of the at least one vibration element and to generate a first induction voltage ($u_{i1}$) serving as an oscillation measurement signal s1, and the second permanent magnet and the second air coil are configured to be moved relative to one another by vibrational movements of the at least one vibration element 11 and to generate a second induction voltage ($u_{i2}$) serving as an oscillation measurement signal s2, wherein the aforementioned first and second induction voltages are dependent in each case in accordance with the law of induction (for motion induction):

$$u_{i1} =$$

$$\frac{d\Psi1}{dt} \sim \Psi1 \cdot 2\pi \cdot f_N \cdot \cos(2\pi \cdot f_N \cdot t) \sim N1 \cdot \Phi1 \cdot 2\pi \cdot f_N \cdot \cos(2\pi \cdot f_N \cdot t) \to s1 \text{ or}$$

$$u_{i2} = \frac{d\Psi2}{dt} \sim \Psi2 \cdot 2\pi \cdot f_N \cdot \cos(2\pi \cdot f_N \cdot t) \sim N2 \cdot \Phi2 \cdot 2\pi \cdot f_N \cdot \cos(2\pi \cdot f_N \cdot t) \to s2$$

on a respective interlinking or induction flux ($\psi1=N1\cdot\Phi1$ or $\psi2=N2\cdot\Phi2$), namely an entire magnetic flux inside the respective first or second air coil, consequently on the respective magnetic flux $\Phi1$ or $\Phi2$ and a respectively associated winding number (N1 or N2). The oscillation measurement signals s1, s2 generated by the measuring sensor 10 are in the further course supplied to the measuring-system electronics ME, for example via electric connecting lines, in order to be correspondingly processed there, for example by means of digital signal processing (DSP), for example namely preamplified, filtered, and digitized and afterwards evaluated accordingly.

According to a further embodiment of the invention, the vibration sensors 51, 52 are also arranged such that, in the event of an excitation of the aforementioned Coriolis vibrations of the at least one vibration element 11, each of the useful components $s1_N$, $s2_N$ of the oscillation measurement signals s1 or s2 also additionally has in each case a phase angle that is dependent on the mass flow rate m of the measurement medium flowing through the measuring sensor 10 and can, for example, be measured relative to the driver signal e1 or the useful component $e1_N$ thereof; this especially in such a way that, as also indicated in FIG. 3, a phase difference $\Delta\varphi12$ ($\Delta\varphi12=f(m)$) that is dependent on said mass flow rate m, exists between the useful component $s1_N$ of the vibration signal s1 and the useful component $s2_N$ of the vibration signal s2, namely a difference between the phase angle of the first useful component $s1_N$ and the phase angle of the second useful component $s2_N$, or that the oscillation measurement signals s1, s2 follow a change in the mass flow rate of the measurement medium conducted in the measuring sensor with a change in said phase difference $\Delta\varphi12$ ($\Delta\varphi12^*$). As is quite usual in such measuring sensors and is also indicated in FIG. 2, the vibration sensors 51, 52 can accordingly each be positioned, for example, at the same distance from a center of mass of the at least one vibration element 11, thus, for example, from the center of mass of the at least one tube or from the center of mass of the at least one displacement element, in such a way that, as viewed in the flow direction, the vibration sensor 51 is arranged on the inlet side of the at least one vibration element 11 or in the vicinity thereof, and the vibration sensor 52 is arranged on the outlet side of the at least one vibration element 11 or in the vicinity thereof. In addition, the two vibration sensors 51, 52 can also be the only vibration sensors that serve to sense vibrations of the at least one vibration element 11, in such a way that the measuring sensor does not have any other vibration sensors apart from said vibration sensors 51, 52. According to a further embodiment of the invention, it is furthermore provided that the measuring sensor has at least one temperature sensor 71 for sensing a temperature of the measuring sensor at a temperature measurement point, said temperature sensor being configured to provide a temperature measurement signal, namely a measurement signal representing the temperature at the temperature measurement point, especially with an electric voltage dependent on the temperature and/or an electric current dependent on temperature. Alternatively or in addition, the measuring sensor can, for example, also have at least one strain sensor serving to sense mechanical stresses within the measuring sensor.

As already mentioned, the measuring-system electronics ME is provided or configured to generate the driver signal e1 and furthermore also to receive and evaluate the oscillation measurement signals s1, s2, namely to determine, on the basis of the oscillation measurement signals s1, s2, for example namely on the basis of the aforementioned phase difference $\Delta\varphi12$ between the first and second useful components, mass-flow-rate measurement values representing the mass flow rate, for example namely also to output said values in the form of analog values and/or in the form of digital values. According to a further embodiment of the invention, the measuring-system electronics 20 is accordingly furthermore configured to first determine the phase difference $\Delta\varphi12$ on the basis of the oscillation measurement signals s1, s2. In addition, the measuring-system electronics ME can also be configured to determine, from at least one of the oscillation measurement signals s1, s2 present, the respective aforementioned phase angle of its respective useful component $s1_N$, $s2_N$, for example relative to the driver signal e1 or the aforementioned useful component $e1_N$ thereof, and/or to determine the useful frequency $f_N$ on the basis of at least one of the oscillation measurement signals s1, s2, for example to also generate, during operation, at least one phase sequence, namely a sequence of digital phase values quantifying the phase angle of one of the first and second useful components, and/or a frequency sequence, namely a sequence of digital frequency values quantifying the useful frequency $f_N$, in such a way that the phase sequence corresponds to a curve over time of the phase angle of the corresponding useful component or the frequency sequence corresponds to a curve over time of the useful frequency. The determination of the phase angles or the generation of the aforementioned phase sequence can be realized, for example, as is quite common in Coriolis mass-flow-rate measuring devices, by means of a quadrature demodulation (Q/I demodulation), carried out accordingly in the measuring-system electronics ME, of the respective oscillation measurement signal using a first harmonic reference signal (Q) having the useful frequency and a second harmonic reference signal (I) phase-shifted 90° thereto. Not least for the mentioned case in which the useful vibrations caused by means of the driver signal e1 are resonant vibrations of the at least one vibration element 11, the useful frequency $f_N$ of the oscillation measurement signals s1, s2 can serve as a measure of the density and/or the viscosity of the measurement medium, and the density and/or the viscosity can accordingly be determined by means of the measuring-system electronics ME on the basis of the aforementioned frequency sequence. Not least for the aforementioned case in which the measuring sensor has a temperature sensor 71 and/or a strain sensor, the measuring-system electronics 20 is also furthermore configured according to a further embodiment of the invention to receive and process, especially namely to digitize and evaluate, the temperature measurement signal generated by the temperature sensor or the strain measurement signal generated by the strain sensor; this, for example, in such a way that the measuring-system electronics ME determines a temperature of the displacement element and/or a temperature of the measurement medium on the basis of the at least one temperature measurement signal.

According to a further embodiment of the invention, the measuring-system electronics ME is furthermore configured to generate, on the basis of the oscillation measurement signal s1, a first useful component sequence, namely a sequence of digital amplitude values $U1_{N1}[M]$ (M∈N—natural numbers) quantifying the amplitude $U1_N$ of the first useful component $s1_N$, and the measuring-system electronics is also configured to generate, on the basis of the oscillation measurement signal s2, a second useful component sequence, namely a sequence of digital amplitude values $U2_{N1}[n]$ (n∈N) quantifying the amplitude $U2_N$ of the second useful component $s2_N$, for example namely in such a way that the amplitude values $U1_{N1}[m]$ are determined at equidistantly successive time points $t_m = m \cdot T_{s1}$, therefore at an update rate $f_{s1}=1/(t_{m+1}-t_m)=1/T_{s1}$, and the amplitude values $U2_N[n]$ are determined at equidistantly successive time points $t_n = n \cdot T_{s2}$, therefore at an update rate $f_{s2}=1/(t_{n+1}-t_n)=1/T_{s2}$, in such a way that the first useful component sequence at least approximately corresponds to a curve over time of the amplitude $U1_N$ of the first useful component $s1_N$ and the second useful component sequence at least approximately corresponds to a curve over time of the amplitude $U2_{N1}$ of the second useful component $s2_N$. The aforementioned update rates $f_{s1}, f_{s2}$ can be selected, for example, such that they are the same ($f_{s1}=f_{s2}$) and/or that an amplitude value $U1_{N1}[m]$ is in each case determined substantially chronologically to a corresponding amplitude $U2_{N1}[n]$ ($t_m=t_n$).

For processing the oscillation measurement signals s1, s2 supplied by the measuring sensor, possibly also the aforementioned temperature measurement signal and/or strain measurement signal, for example namely also for determining the mass-flow-rate measurement values and possibly also for determining the density measurement values and/or the viscosity measurement values, the measuring-system electronics ME can furthermore have, as indicated above, a corresponding measurement and control electronics DSV, which, as shown schematically in FIG. 2, is electrically connected to the measuring sensor 10 or the vibration sensors 51, 52 thereof, for example in such a way that a first measurement signal input of the measuring-system electronics ME for the oscillation measurement signal s1 and at least one second measurement signal input of the measuring-system electronics 20 for the oscillation measurement signal s2 are formed by the measurement and control electronics DSV. The measurement and control electronics DSV can advantageously be configured to digitally process the supplied vibration measurement signals s1, s2, and possibly also the temperature measurement signals and/or strain measurement signals, for example specifically by means of at least one microprocessor and/or at least one digital signal processor (DSP) and/or by means of a programmable logic module (FPGA) and/or by means of a custom-programmed logic module (ASIC). The program codes executed in one or more of the aforementioned microprocessors or digital signal processors of the measuring-system electronics ME during operation of the measuring system can each be stored persistently, for example, in one or more non-volatile data memories (EEPROM) of the measuring-system electronics ME and, when the latter is started up, can be loaded into a volatile data memory (RAM) provided in the measuring-system electronics ME or in the measurement and control electronics DSV, for example integrated in the microprocessor. For processing in the microprocessor or in the digital signal processor, the vibration measurement signals s1, s2 can of course first be converted into corresponding digital signals by means of corresponding analog-to-digital converters (ND), for example specifically by digitizing the respective signal voltage of the vibration measurement signals s1, s2; cf. for example the aforementioned U.S. Pat. No. 6,311,136 or US-A 2011/0271756. Accordingly, according to a further embodiment of the invention, a first analog-to-digital converter for the oscillation measurement signal s1 and a second analog-to-digital converter for the oscillation measurement signal s2 are provided in the measuring-system electronics ME, for example namely in the aforementioned measurement and control electronics DSV, and/or at least one non-volatile electronic data memory EEPROM is provided in the measuring-system electronics ME and configured to store digital data, for example namely even without an applied operating voltage. The aforementioned phase sequence and/or the aforementioned frequency sequence can additionally also be generated by means of the measurement and control electronics DSV, for example namely also output at a corresponding digital phase output or at a corresponding digital frequency output and thus provided for further processing in the measuring-system electronics ME. For the case in which the measuring-system electronics ME is formed by means of the aforementioned drive electronics Exc and by means of the aforementioned measurement and control electronics DSV, its phase output can be electrically connected to a phase input, which is provided in the drive electronics Exc and, for example, also forms a component of the aforementioned phase-locked loop (PLL), of a phase comparator and said phase comparator can also be configured to identify a phase difference between the aforementioned signal component $e1_N$ of the driver signal e1 and at least one of the useful components $s1_N, s2_N$ on the basis of the phase sequence and/or to determine the extent of said phase difference. According to a further embodiment of the invention, the measurement and control electronics DSV is also configured to generate the aforementioned first and second useful component sequences and to output at least one of the useful component sequences at a digital amplitude output. The aforementioned amplitude output of the measurement and control electronics DSV can furthermore also be electrically connected, for example, to an amplitude input, which senses an amplitude of the vibrations of the at least one vibration element 11, of the drive electronics Exc and the drive electronics Exc can additionally be configured to generate the driver signal e1 on the basis of the amplitude sequence such that the vibrations of the at least one vibration element or its useful vibrations reach or do not permanently exceed or fall below a specified vibration amplitude.

As already mentioned, the useful components of the two oscillation measurement signals s1, s2 or their amplitudes, owing to the operating principle of the two electrodynamic vibration sensors, are dependent on the change over time of the magnetic flux inside the vibration sensor namely in the case of a plunger coil as the vibration sensor, the interlinking or induction flux inside the respective air coil; this especially also in such a way that an additional influence caused from outside the measuring system during the measurement operation thereof, on the known internal magnetic field H0 and an associated influence on a known change behavior ($\Delta\Phi1/\Delta t$, $\Delta\Phi2/\Delta t$), namely determined by the aforementioned calibration, of the magnetic flux inside the first and/or second vibration sensor, not least also a change behavior ($\Delta\Phi1, \Delta\Phi2$) of the magnetic flux $\Phi1$ or $\Phi2$ per vibration period of the useful vibrations, can, by means of an external magnetic field H1 caused outside the measuring system but also propagating inside the measuring system, cause an undesired influence on the first and/or second useful component, for example namely an influence leading to increased errors in the measurement of the mass flow rate, and thus impairment of the functionality of the measuring sensor. Causes of such an external magnetic field H1, which is possibly also constant over a longer period of time, can, for example, be an electric field generated in the vicinity of the respective measuring system, e.g., owing to electric motors, transformers, inverters or plant parts carrying high electric (direct) currents, such as bus bars, operating in the vicinity of the measuring system, and/or can, as also indicated in FIG. 4b, be a magnet, e.g., an electromagnet or a permanent magnet, positioned outside the respective measuring system or in the vicinity thereof. In the case of plunger coils as vibration sensors, the aforementioned internal magnetic field H0 is in each case substantially defined by their respective permanent magnets, and the aforementioned change behavior of the magnetic flux is substantially defined by the movements, corresponding to the vibrational movements of the at least one vibration element, of the respective permanent magnet in the associated air gap, and the external magnetic field H1 can result in at least one of the aforementioned flux densities (B1 or B2), corresponding to the internal magnetic field H0, of the respective magnetic flux $\Phi 1$ or $\Phi 2$ being changed (B1→B1'=B1+ΔB1, B1→B2'=B2+ΔB2). Such an undesirable influence on the first and/or second useful component $s1_N$, $s2_N$ and impairment of the functionality of the measuring sensor by an external magnetic field H1 can, for example, also consist of that, as also indicated in FIG. 3, at least one of the useful components contains an additional interference component ($S1_{N,Err}$, $S2_{N,Err}$) of equal frequency, in such a way that the aforementioned phase angle of said useful component, and therefore also the aforementioned phase difference $\Delta\Phi 12$ ($\Delta\Phi 12 \to \Delta\Phi 12_{Err}$) then has a phase error, namely a fraction dependent on the external magnetic field H1 or the influence thereof on the magnetic flux ultimately established in the respective vibration sensor; this, for example, also in such a way that the integrity of at least one of the oscillation measurement signals or of the mass-flow-rate measurement values is unacceptably reduced, or that said phase error drives a measurement accuracy, with which the measuring-system electronics 20 then determines the mass-flow-rate measurement values, out of a tolerance range specified for the measuring system.

In order to enable the most timely, nevertheless precise, detection of an external magnetic field H1, which possibly impairs the functionality of the measuring sensor or which causes an increased measurement error lying outside a specification of the measuring system, the measuring system according to the invention, as also shown schematically in FIGS. 4a and 4b, furthermore has at least one first magnetic-field detector 61 serving to sense a magnetic field H0+H1, namely resulting here especially by the superposition of the internal magnetic field H0 and the external magnetic field H1 and established inside the measuring system but at least proportionally also outside the vibration sensors 51, 52. With the measuring system according to the invention, the magnetic-field detector 61 is positioned especially outside the sensor housing 100; this especially also in such a way that the magnetic-field detector 61 is also positioned outside the aforementioned electronics housing 200. For this purpose, the magnetic-field detector 61 can, for example, be attached to the outside of the sensor housing 100, especially namely it can also be fixed directly to the sensor housing. According to a further embodiment of the invention, it is furthermore provided that the magnetic-field detector 61 is positioned in the vicinity of the vibration sensor 51, for example also less than 5 cm away therefrom.

Especially, the magnetic-field detector 61 is configured to convert changes in the magnetic field H0+H1 at a third measurement point formed by the magnetic-field detector 61 and remote from both the aforementioned first measurement point and the aforementioned second measurement point into a, for example electrical, first magnetic-field signal φ1, which has an amplitude U3 dependent on a third magnetic flux $\Phi 3$ established here both outside the vibration sensor 51 and outside the vibration sensor 52, namely a magnetic flux through the magnetic-field detector 61 and/or on an area density B3 of said magnetic flux $\Phi 3$; this especially in such a way that the magnetic-field signal φ1 follows at least a change in the magnetic flux $\Phi 3$ and/or its area density B3 with a change in the amplitude U3. The magnetic-field detector 61 can be formed, for example, by means of at least one Hall sensor and/or by means of at least one reed switch.

The magnetic-field detector is furthermore electrically connected to the measuring-system electronics 20 via connecting lines laid especially along the outside of the sensor housing. As indicated in FIG. 2, said connecting lines can also be provided, for example, by means of a connecting cable and/or can at least in some sections be laid inside a protective tube or protective hose fastened to the outside of the sensor housing and/or electronics housing. With the measuring system according to the invention, the measuring-system electronics 20 is also additionally configured to determine at least qualitatively on the basis of the magnetic-field signal φ1, whether inside the measuring sensor, the aforementioned external magnetic field H1 is also established in addition to the aforementioned internal magnetic field H0, for example namely to determine whether a disturbance, especially reducing the functionality of the measuring sensor and/or causing a malfunction of the measuring sensor overall and/or reducing an integrity of at least one of the first and second oscillation measurement signals or of the mass-flow-rate measurement values, of the measuring sensor by the external magnetic field H1 is present.

The magnetic-field signal φ1 can, for example, be a signal that only qualitatively evaluates the aforementioned magnetic field H0+H1 or its changes, or that only assumes discrete values to a limited extent, for example namely also a binary switching signal that nominally only has two states. The magnetic-field signal φ1 can, however, also be, for example, an analog signal that quantifies the magnetic field H0+H1 or its changes in a continuous-value and continuous-time manner, for example namely an analog electrical signal with a electrical voltage dependent on the magnetic flux $\Phi 3$ and/or on its area density B3. Not least for the above-described case that the magnetic-field signal φ1 is designed as an analog signal, the measuring-system electronics 20 according to a further embodiment of the invention is furthermore also configured to also at least occasionally calculate, on the basis of the at least one magnetic-field signal, one or more characteristic number values for at least one magnetic-field characteristic number MK1, for example namely an influence on the measuring sensor by the external magnetic field and/or an influence on at least one of the magnetic fluxes $\Phi 1$, $\Phi 2$, in such a way that said magnetic-field characteristic number MK1; this especially in such a way that the magnetic-field characteristic number MK1 is dependent on a deviation of the magnetic flux $\Phi 1$ from the magnetic flux $\Phi 2$, and/or evaluates and/or quantifies said deviation; alternatively, said magnetic-field characteristic number MK1 is also selected or can be calculated such that the magnetic-field characteristic number MK1 is dependent on a deviation of the magnetic flux $\Phi 3$ from a reference value determined in advance and thus indirectly also on a deviation of at least the magnetic flux $\Phi 1$ from the reference value and/or evaluates and/or quantifies said deviation, and the following thus, for example, applies to the sensor characteristic number MK1:

$$MK1 = f(U3) = f(\Phi3(\Phi1)) = f(H0, H1) \quad (1)$$

The magnetic-field characteristic number MK1 can be repeatedly determined by means of the measuring-system electronics ME during operation of the Coriolis mass-flow-rate measuring device, for example on the basis of digital amplitude values determined for the amplitude U3 of the magnetic-field signal φ1. In the mentioned case in which at least one non-volatile electronic data memory EEPROM is provided in the measuring-system electronics ME, the measuring-system electronics ME can also be configured to store one or more of the aforementioned digital amplitude values for the amplitude U3 in said data memory EEPROM, for example also in each case together with a number value for a time variable (time stamp) corresponding to a respective time point of the determination of the respective characteristic number value.

In order to detect the presence of an external magnetic field H1 that impairs the functionality of the measuring sensor and therefore the measurement accuracy of the measuring system, the measuring-system electronics 20 according to a further embodiment of the invention is furthermore configured to evaluate one or more characteristic number values for the at least one magnetic-field characteristic number MK1, for example namely to compare them in each case to one or more reference values $BK1_1$ ($BK1_1$, $BK1_2$, ... $BK1_i$, ...) determined in advance for said magnetic-field characteristic number MK1, for example namely stored in the aforementioned non-volatile electronic data memory EEPROM. Accordingly, the measuring-system electronics ME is furthermore also configured to determine whether one or more characteristic number values for the magnetic-field characteristic number MK1 are greater than one or more such reference values for the magnetic-field characteristic number MK1, for example namely reference values representing a measuring system that is no longer intact, and possibly, for example, also to output a (fault) message indicating this, for example namely to display it on site and/or to transmit it as a status message to the aforementioned electronic data processing system. The aforementioned reference values for the magnetic-field characteristic number MK1 can, for example, be reference values representing a reduced functionality (attributable to an external magnetic field) of the measuring sensor or a malfunction (attributable to an external magnetic field) of the measuring sensor. Said reference values can be determined, for example, in advance, for example namely by the manufacturer of the measuring system or during a (factory) calibration carried out during the production of the measuring system and/or during commissioning on site and/or during operation of the measuring system; this, for example, in such a way that first the respective magnetic-field characteristic number MK1 is determined for the finished and therefore intact measuring system and is converted into the reference value $BK1_1$ with a tolerance value corresponding to a still tolerable influence, and/or in that the magnetic-field characteristic number MK1 is determined directly by means of the measuring system that is positioned in the vicinity of a magnet causing a reference magnetic field but is otherwise intact, and is stored as a reference value $BK1_1$ in the data memory EEPROM.

The determination of the characteristic number values MK1 or the determination of the presence of an external magnetic field can be initiated or suspended again, for example, in an automated manner, for example namely in a time-controlled manner and/or also as a function of changes in other diagnostic values. Alternatively or in addition, however, the determination of the characteristic number values can also be initiated and/or suspended from outside the measuring system, for example namely starting from the aforementioned electronic data processing system via the aforementioned transmitting and receiving electronics COM and/or starting from operating personnel on site via the aforementioned display and operating element HMI. Accordingly, the measuring-system electronics 20 according to a further is configured to receive and evaluate a start command that initiates at least the determination of the characteristic number values for at least the magnetic-field characteristic number MK1, possibly namely also the aforementioned evaluation thereof, namely to detect an input of the start command and then to start a determination of the characteristic number values for the first magnetic-field characteristic number MK1, and/or the measuring-system electronics is configured to receive and evaluate a stop command that at least temporarily suspends the determination of the characteristic number values for the magnetic-field characteristic number MK1, namely to detect an input of the stop command and then at least temporarily stop a determination of the characteristic number values for the first magnetic-field characteristic number MK1.

For the aforementioned case that the measuring-system electronics ME is formed by means of two electronics modules ME1, ME2, the electronics module ME1 can, for example, be configured both to generate the aforementioned driver signal e1 and to receive and evaluate the oscillation measurement signals s1, s2, and the electronics module ME2 can, for example, be configured to receive and evaluate the magnetic-field signal φ1, for example namely to calculate the aforementioned magnetic-field characteristic number MK1 and/or to appropriately compare it to the aforementioned reference values $BK1_1$ and/or to generate the aforementioned (fault) message. In addition, a signal output of the electronics module ME2 can be electrically connected to a corresponding signal input of the electronics module ME1, and the electronics module ME2 can be configured to transmit the aforementioned (fault) message to the electronics module ME1. Alternatively or in addition, the electronics module ME2 can be configured to receive measurement values determined by the electronics module ME1 and to output them accordingly at a signal output, for example in such a way that no measurement values, especially no mass-flow-rate measurement values, are output if a disturbance by the external magnetic field H1 is present, or that mass-flow-rate measurement values are output at most as qualified measurement values of the measuring system if no such disturbance is present. According to a further embodiment, the measuring-system electronics 20 is furthermore also configured to monitor the functionality of the magnetic-field detector 61 itself, for example, by evaluating the magnetic-field signal φ1; especially in such a way that measuring-system electronics ME checks, on the basis of the magnetic-field signal φ1 and/or on the basis of a measurement of an electrical resistance and/or of an electrical impedance of the connecting lines electrically connecting the magnetic-field detector 61 and the measuring-system electronics ME, whether magnetic-field detector 61 and measuring-system electronics ME are still electrically connected to one another.

In order to protect the at least one magnetic-field detector 61 from interfering or harmful environmental influences or to reduce or avoid environmental disturbances of the magnetic-field detector 61, the measuring system according to a further embodiment of the invention comprises a protective shield 300 for the at least one magnetic-field detector, for example a protective shield consisting of a stainless steel, e.g., 1.4404 (St 316L). As is also shown schematically in FIG. 2, said protective shield 300 is positioned outside the sensor housing 100 to form an intermediate space 300*, which is located between the protective shield and the sensor housing 100 and is suitable for accommodating at least the magnetic-field detector 61, and the magnetic-field detector 61 is then positioned inside the intermediate space. The protective shield 300 can, for example, be attached to the outside of the sensor housing 100, for example namely firmly bonded thereto, especially namely welded thereto. The protective shield 300 can, however, also be releasably connected to the sensor housing 100, for example namely screwed thereon and/or buckled onto the sensor housing 100. Alternatively or in addition, the protective shield 300 can also be attached to the aforementioned electronics housing 200. Advantageously, the protective shield 300 can, for example, also be configured or designed to shield the measuring sensor or both the measuring sensor MW and the magnetic-field detector against the external magnetic field H1. For this purpose, the protective shield 300 can also consist at least partially of a ferromagnetic material, for example a ferritic steel. Not least for the aforementioned case that the protective shield is releasably connected to the sensor housing 100 and/or the electronics housing 200, the protective shield 300 according to a further embodiment is secured by means of at least one seal on the sensor housing or on the electronics housing, for example namely against unauthorized removal.

Figure 5B:
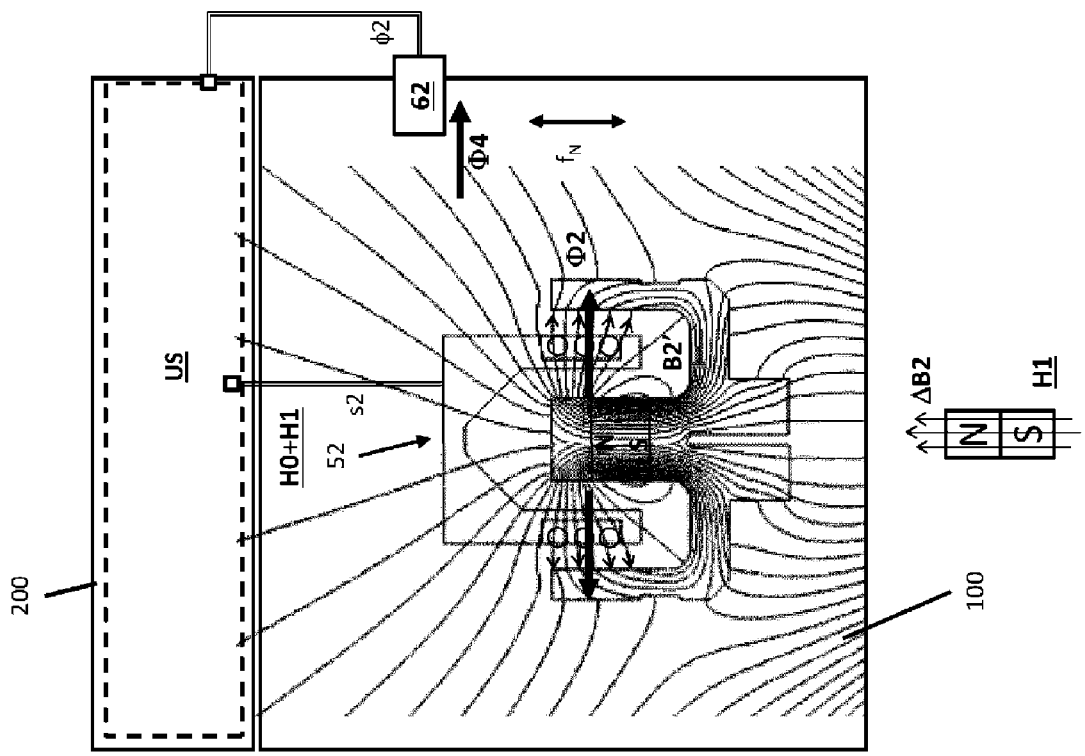
FIG. 5a, 5b shows a schematic representation respectively of a further vibration sensor of the measuring sensor according to FIG. 4a or 4b, and field lines of the magnetic field penetrating the measuring sensor in each case.
Figure 5A:
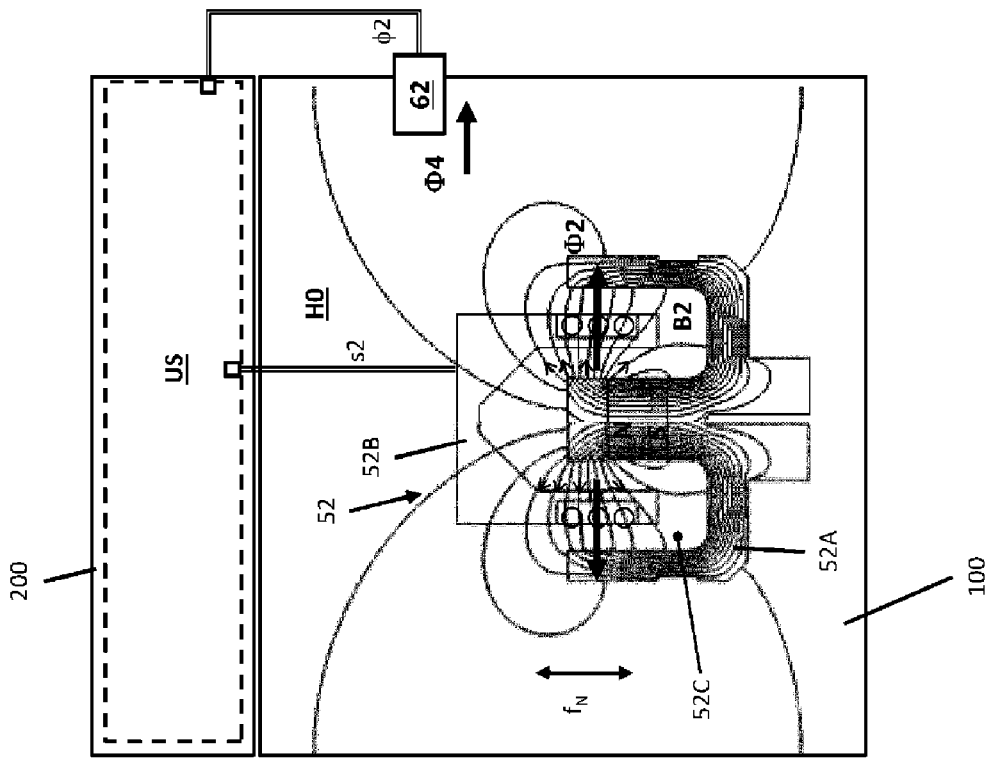

In order to further increase the accuracy or reliability with which the presence of the external magnetic field can be determined, it is provided according to a further embodiment of the invention that the measuring system for sensing the magnetic field has, as also indicated respectively in FIG. 2 or 5a and 5b or also readily apparent from the combination thereof, at least one second magnetic-field detector 62, which is, for example, also structurally identical to the magnetic-field detector 61, and is configured to convert changes in the magnetic field H0 or H0+H1 at a fourth measurement point remote from the aforementioned third measurement point, namely for example, also remote from the first measurement point and/or from the second measurement point, into a second magnetic-field signal φ2, especially namely one that evaluates changes in the magnetic field and/or quantifies the changes and/or is electrical, said second magnetic-field signal having an amplitude U4 dependent on a fourth magnetic flux Φ4, namely a magnetic flux through the magnetic-field detector 62 and/or on an area density B4 of said magnetic flux Φ4, in such a way that the magnetic-field signal φ2 follows at least a change in the fourth magnetic flux Φ4 and/or its area density B4 with a change in the amplitude U4. Furthermore, the measuring-system electronics 20 is also configured to also receive and evaluate the magnetic-field signal φ2, namely to determine on the basis of the magnetic-field signal φ2 whether the external magnetic field H1 is present. The magnetic-field signal φ2 can however also be designed as an analog signal, for example with an electrical voltage dependent on the magnetic flux Φ4 and/or its area density B4. Accordingly, the magnetic-field detector 62 can be formed by means of a Hall sensor and/or a reed switch. According to a further embodiment of the invention, it is additionally provided that the magnetic-field detector 62 is also positioned outside the sensor housing 100, for example namely attached to the outside of the sensor housing 100. In addition, the magnetic-field detector 62 can, for example, be positioned in the vicinity of the vibration sensor 52, especially namely less than 5 cm and/or less far away from the vibration sensor 52 than from the vibration sensor 51. Alternatively or in addition, the magnetic-field detector 62 can also, for example, be positioned less far away from the vibration sensor 51 than from the vibration sensor 52. For the aforementioned case in which the measuring system has a protective shield, the magnetic-field detector 62 can, for example, also be positioned next to the magnetic-field detector 61 in the intermediate space. If necessary, the measuring system can additionally also have further magnetic-field detectors, for example in such a way that magnetic-field detectors are positioned both on the front side and on the rear side of the sensor housing and/or both on the left side and on the right side of the sensor housing/or both on the top side and on the underside of the sensor housing or in such a way that at least one magnetic-field detector, for example namely in each case two or more and/or in each case the same number of magnetic-field detectors, is arranged on at least two opposite sides of the measuring sensor or its sensor housing.

The invention claimed is:

1. A vibronic measuring system for measuring a mass flow rate of a fluid measurement medium, the vibronic measuring system comprising:
 a measuring sensor, including:
  at least one vibration element;
  at least one oscillation exciter for exciting and maintaining mechanical oscillations of the at least one vibration element; and
  an electrodynamic first vibration sensor and a electrodynamic second vibration sensor, wherein the first vibration sensor and the second vibration sensor are for sensing mechanical oscillations of the at least one vibration element,
  wherein the measuring sensor is configured to guide the measurement medium and to at least intermittently be flowed through by the measurement medium;
 a sensor housing for the measuring sensor;
 at least one first magnetic-field detector for sensing a magnetic field that is established inside the measuring system; and
 a measuring-system electronics electrically coupled both to the measuring sensor, including its at least one oscillation exciter and its first and second vibration sensors, and to the first magnetic-field detector,
 wherein the measuring sensor is positioned inside the sensor housing and the first magnetic-field detector is positioned outside the sensor housing,
 wherein the at least one vibration element is configured to be contacted by the flowing substance to be measured and to be vibrated at the same time,
 wherein the at least one oscillation exciter is configured to convert electrical power fed to the oscillation exciter into mechanical power causing forced mechanical oscillations of the vibration element,
 wherein the measuring-system electronics is configured to generate an electrical driver signal and to feed electrical power into the at least one oscillation exciter by means of the driver signal such that the vibration element executes at least proportionally useful vibrations, namely forced mechanical oscillations at at least one useful frequency, namely an oscillation frequency specified by the electrical driver signal, wherein the useful vibrations are suitable for causing, in the flowing measurement medium, Coriolis forces dependent on the mass flow rate, wherein the first vibration sensor is configured to convert vibrational movements of the at least one vibration element at a first measurement point into an electrical first oscillation measurement signal of the measuring sensor such that the first oscillation measurement signal has a first useful component, namely an AC voltage component at a frequency corresponding to the useful frequency and at an amplitude dependent on the useful frequency and a first magnetic flux, namely a magnetic flux through the first vibration sensor, wherein the second vibration sensor is configured to convert vibrational movements of the at least one vibration element at a second measurement point remote from the first measurement point into an electrical second oscillation measurement signal of the measuring sensor in such a way that said second oscillation measurement signal has a second useful component, namely an AC voltage component at a frequency corresponding to the useful frequency and at an amplitude dependent on the useful frequency and a second magnetic flux, namely a magnetic flux through the second vibration sensor, wherein the first magnetic-field detector is configured to sense the magnetic field at a third measurement point located outside the sensor housing and to convert it into a first magnetic-field signal that shows an amplitude dependent on a third magnetic flux, namely a magnetic flux through the first magnetic-field detector and/or on an area density of said magnetic flux such that the first magnetic-field signal follows at least a change in the third magnetic flux and/or in its area density with a change in the amplitude, and wherein the measuring-system electronics is configured to receive and evaluate both the first and second oscillation measurement signals and at least the first magnetic-field signal, namely to determine, on the basis of the firsts and second oscillation measurement signals, the mass-flow-rate measurement values representing the mass flow rate and, on the basis of the first magnetic-field signal, to at least qualitatively determine whether and/or to what extent the magnetic field is established at the first and/or second measurement points, or contributes to the first and/or second magnetic fluxes, and/or to determine whether a disturbance of the measuring system by the magnetic field is present.

2. The measuring system according to claim 1, further comprising:
at least one electronics housing constructed in a modular manner,
wherein the measuring-system electronics is accommodated at least partially or completely inside the electronics housing and/or wherein the first magnetic-field detector is positioned outside the electronics housing.

3. The measuring system according to claim 2, wherein the sensor housing has a connection piece for the electronics housing and wherein the electronics housing is mechanically connected to the connection piece.

4. The measuring system according to claim 1, further comprising:
a metallic protective shield for the at least one magnetic-field detector, wherein the protective shield is positioned outside the sensor housing, is attached to the outside of the sensor housing to form an intermediate space located between the protective shield and the sensor housing, and wherein the magnetic-field detector is positioned inside said intermediate space.

5. The measurement system according to claim 4,
wherein the protective shield at least partially consists of a stainless steel, and/or
wherein the protective shield is firmly bonded to the sensor housing, and/or
wherein the protective shield is secured to the sensor housing by at least one seal.

6. The measuring system according to claim 5, wherein the electronics housing is designed in a modular manner such that the electronics housing has a first housing module and a second housing module, and wherein the first housing module is attached to the outside of the sensor housing and/or the second housing module is attached to the outside of the first housing module.

7. The measuring system according to claim 6, wherein the measuring-system electronics is designed in a modular manner such that the measuring-system electronics has a first electronics module and a second electronics module.

8. The measuring system according to claim 7,
wherein the first housing module of the electronics housing is configured to receive the first electronics module of the measuring-system electronics, and the second housing module of the electronics housing is configured to receive the second electronics module of the measuring-system electronics, and
wherein the first electronics module is accommodated inside the first housing module, and the second electronics module is accommodated inside the second housing module.

9. The measuring system according to claim 7,
wherein the first electronics module of the measuring-system electronics is configured both to generate the driver signal and to receive and evaluate the first and second oscillation measurement signals, and the second electronics module of the measuring-system electronics is configured to receive and evaluate the first magnetic-field signal, and/or
wherein the first and second electronics modules of the measuring-system electronics are electrically coupled to one another such that a signal output of the first electronics modules electrically connected to a signal input of the second electronics module.

10. The measuring system according to claim 1, wherein the first magnetic-field signal is a value-continuous and time-continuous analog signal with a voltage dependent on the third magnetic flux and/or on its area density.

11. The measuring system according to claim 10, wherein the measuring-system electronics is configured to calculate, on the basis of the first magnetic-field signal, characteristic number values for at least one magnetic-field characteristic number characterizing an influence on the measuring sensor by the external magnetic field and/or an influence on at least one of the first and second magnetic fluxes in such a way that said magnetic-field characteristic number is dependent on a deviation of the first magnetic flux from the second magnetic flux and/or evaluates and/or quantifies said deviation or that said magnetic-field characteristic number is dependent on a deviation of the first magnetic flux from a reference value determined in advance and/or evaluates and/or quantifies said deviation.

12. The measuring system according to claim 11, wherein the measuring-system electronics is configured to compare one or more characteristic number values for the magnetic-field characteristic number with in each case one or more reference values determined for the magnetic-field characteristic number by the manufacturer of the Coriolis mass-flow-rate measuring device and/or during the production of the Coriolis mass-flow-rate measuring device, including one or more reference values representing a reduced functionality of the measuring sensor, and/or one or more reference values representing a malfunction of the measuring sensor, and/or one or more reference values representing a Coriolis mass-flow-rate measuring device that is no longer intact.

13. The measuring system according to claim 12, wherein the measuring-system electronics is configured to determine whether one or more characteristic number values for the magnetic-field characteristic number is greater than the at least one reference value for the magnetic-field characteristic number, namely if one or more characteristic number values for the magnetic-field characteristic number are greater than one or more reference values representing a reduced functionality of the measuring sensor and/or are greater than one or more reference values representing a malfunction of the measuring sensor and/or are greater than one or more reference values representing a Coriolis mass-flow-rate measuring device that is no longer intact, to output a message indicating this.

14. The measuring system according to claim 1, wherein the measuring-system electronics has a non-volatile electronic data memory (EEPROM) that is configured to store digital data even without an applied operating voltage.

15. The measuring system according to claim 14, wherein one or more reference values for the magnetic-field characteristic number, namely one or more reference values representing a reduced functionality of the measuring sensor and/or namely one or more reference values representing a malfunction of the measuring sensor, are stored in the electronic data memory.

16. The measuring system according to claim 15, wherein the measuring-system electronics is configured to compare one or more characteristic number values for the magnetic-field characteristic number in each case to one or more reference values, stored in the data memory, for the magnetic-field characteristic number.

17. The measuring system according to claim 1, wherein the first magnetic-field detector is formed by means of at least one Hall sensor.

18. The measuring system according to claim 1, wherein the first magnetic-field detector is formed by means of at least one reed switch.

19. The measuring system according to claim 1, wherein the first magnetic-field detector is positioned less far away from the first vibration sensor than from the second vibration sensor and/or less than 5 cm away from the first vibration sensor.

20. The measuring system according to claim 1, further comprising:
a second magnetic-field detector formed by means of a Hall sensor and/or a reed switch and/or structurally identical to the first magnetic-field detector, wherein the second magnetic field detector, is for sensing the magnetic field,
wherein the second magnetic-field detector is configured to sense the magnetic field at a fourth measurement point remote from the third measurement point, especially also remote from the first measurement point and/or from the second measurement point and/or located outside the sensor housing, and to convert it into a second magnetic-field signal, which evaluates and/or quantifies the magnetic field and/or is electrical and which has an amplitude dependent on a fourth magnetic flux, namely a magnetic flux through the second magnetic-field detector, and/or on an area density of said magnetic flux such that the second magnetic-field signal follows at least a change in the fourth magnetic flux and/or in its area density with a change in the amplitude, and
wherein the measuring-system electronics is also configured to also the second magnetic-field signal to receive and evaluate, namely to determine whether the external magnetic field is based on the second magnetic-field signal is present.

21. The measurement system according to claim 20,
wherein the second magnetic-field detector is positioned in the vicinity of the second vibration sensor, and/or
wherein the second magnetic-field detector is positioned outside the sensor housing such that the second magnetic-field detector is attached to the outside of the sensor housing, and/or
wherein the second magnetic-field signal is an analog signal having a voltage dependent on the fourth magnetic flux and/or its area density.

22. The measuring system according to claim 1, wherein the measurement and control electronics has a first analog-to-digital converter for the first oscillation measurement signal and a second analog-to-digital converter for the second oscillation measurement signal.

23. The measuring system according to claim 22, wherein the measuring-system electronics a third analog-to-digital converter for the first magnetic-field signal.

24. The measuring system according to claim 23, wherein the measuring-system electronics a fourth analog-to-digital converter for the second magnetic-field signal.

25. The measuring system according to claim 1, wherein the first vibration sensor is formed by means of a first plunger coil, and the second vibration sensor is formed by means of a second plunger coil.

26. The measuring system according to claim 1,
wherein the first vibration sensor has a first permanent magnet connected mechanically to the at least one vibration element to form the first measurement point, and a first air coil,
wherein the first permanent magnet forms a first air gap carrying the first magnetic flux, and the first air coil is positioned at least partially inside said first air gap,
wherein the first permanent magnet and the first air coil are configured to be moved relative to one another by vibrational movements of the at least one vibration element and to generate a first induction voltage serving as a first oscillation measurement signal,
wherein the second vibration sensor has a second permanent magnet connected mechanically to the at least one vibration element to form the second measurement point, and a second air coil,
wherein the second permanent magnet forms a second air gap carrying the second magnetic flux, and the second air coil is positioned at least partially inside said second air gap, and
wherein the second permanent magnet and the second air coil are configured to be moved relative to one another by vibrational movements of the at least one vibration element and to generate a second induction voltage serving as a second oscillation measurement signal.

27. The measuring system according to claim 1, wherein each of the first and second useful components has a phase angle dependent on the mass flow rate.

28. The measuring system according to claim 27, wherein the measuring-system electronics is configured to calculate the mass-flow-rate measurement values on the basis of a phase difference between the first and second useful components, namely a difference between the phase angle of the first useful component and the phase angle of the second useful component.

29. The measuring system according to claim 1, wherein the at least one vibration element is formed by means of at least one tube, which is straight at least in some sections and/or arcuate at least in some sections, with one of a metallic tube wall, and a lumen surrounded by said tube wall and is configured to be flowed through by the measurement medium and to be allowed to vibrate meanwhile.

* * * * *